US012594602B2

(12) United States Patent
Alberts

(10) Patent No.: US 12,594,602 B2
(45) Date of Patent: Apr. 7, 2026

(54) SYSTEMS AND METHODS FOR SIMULATING PROCESS MONITORING

(71) Applicant: Nikon SLM Solutions AG, Luebeck (DE)

(72) Inventor: Daniel Alberts, Luebeck (DE)

(73) Assignee: Nikon SLM Solutions AG, Luebeck (DE)

( * ) Notice: Subject to any disclaimer, the term of this patent is extended or adjusted under 35 U.S.C. 154(b) by 692 days.

(21) Appl. No.: 17/911,028

(22) PCT Filed: Mar. 8, 2021

(86) PCT No.: PCT/EP2021/055711

§ 371 (c)(1),
(2) Date: Sep. 12, 2022

(87) PCT Pub. No.: WO2021/197762

PCT Pub. Date: Oct. 7, 2021

(65) Prior Publication Data

US 2023/0141266 A1     May 11, 2023

(30) Foreign Application Priority Data

Apr. 1, 2020     (DE) ..................... 10 2020 109 100.1

(51) Int. Cl.
*B22F 10/85*          (2021.01)
*B22F 10/28*          (2021.01)
(Continued)

(52) U.S. Cl.
CPC .............. *B22F 10/85* (2021.01); *B22F 10/28* (2021.01); *B22F 10/366* (2021.01); *G06F 30/20* (2020.01); *B33Y 10/00* (2014.12); *B33Y 50/02* (2014.12)

(58) Field of Classification Search
CPC ........ B22F 10/85; B22F 10/28; B22F 10/366; B22F 10/368; B22F 10/38; B22F 12/90;
(Continued)

(56) References Cited

U.S. PATENT DOCUMENTS 8,977,526 B1 * 3/2015 Jedlowski ................ G09B 9/00
                                                    703/6
2016/0179064 A1   6/2016 Arthur et al.
(Continued)

FOREIGN PATENT DOCUMENTS

CN           108290219          7/2018
DE       102016122522          5/2018
(Continued)

OTHER PUBLICATIONS

China National Intellectual Property Administration, CN Examination Report for International Patent Application No. CN 202180027190. 4, Jun. 28, 2024.
(Continued)

*Primary Examiner* — Michael J Brown
(74) *Attorney, Agent, or Firm* — Williams Mullen; Thomas F. Bergert

(57)          ABSTRACT

We describe a system for simulating process monitoring by a sensor system in an additive layer manufacturing, in particular selective laser melting, process used to solidify material from which a three-dimensional workpiece is to be produced, wherein the system comprises: a data input coupleable to a data output of the sensor system and configured to receive, from the sensor system, sensor data relating to the process monitored by the sensor system, wherein the data input is further configured to receive one or more input parameters (i) relating to the additive layer manufacturing process and/or (ii) associated with an additive layer manufacturing apparatus used for the additive
(Continued)

100 layer manufacturing process and/or (iii) associated with the process monitoring and/or the sensor system; and a processing unit coupled to the data input and configured to generate, from the sensor data and the one or more input parameters, a model for simulating said process monitoring.

19 Claims, 14 Drawing Sheets

(51) Int. Cl.
| | |
|---|---|
| *B22F 10/366* | (2021.01) |
| *G06F 30/20* | (2020.01) |
| *B22F 12/90* | (2021.01) |
| *B33Y 10/00* | (2015.01) |
| *B33Y 30/00* | (2015.01) |
| *B33Y 50/02* | (2015.01) |

(58) Field of Classification Search
CPC .. G06F 30/20; G06F 2113/10; G06F 2119/18; B33Y 10/00; B33Y 50/02; B33Y 30/00; Y02P 10/25; Y02P 90/02; G05B 17/02; G05B 19/4099; G06N 3/084
USPC .......................................................... 700/98
See application file for complete search history.

(56) References Cited

U.S. PATENT DOCUMENTS

| | | | |
|---|---|---|---|
| 2017/0232515 A1 | 8/2017 | Demuth et al. | |
| 2018/0154484 A1 | 6/2018 | Hall | |
| 2018/0341248 A1* | 11/2018 | Mehr | G06N 20/10 |
| 2019/0022924 A1 | 1/2019 | Schumann et al. | |
| 2019/0227525 A1 | 7/2019 | Mehr et al. | |

FOREIGN PATENT DOCUMENTS

| | | |
|---|---|---|
| JP | 2020527475 | 9/2020 |
| WO | 2015109096 | 7/2015 |
| WO | 2018217903 | 11/2018 |

OTHER PUBLICATIONS

International Search Report and Written Opinion for PCT/EP2021/055711, European Patent Office, Jun. 2, 2021.
Search Report for German Application No. 10 2020 109 100.1, German Patent and Trademark Office, Dec. 12, 2020.
Japanese Patent Office, Japanese Examination Report for JP 2022-559845, Oct. 31, 2023.

* cited by examiner

FIG 6

| FIG 6A |
|--------|
| FIG 6B |

FIG 6A

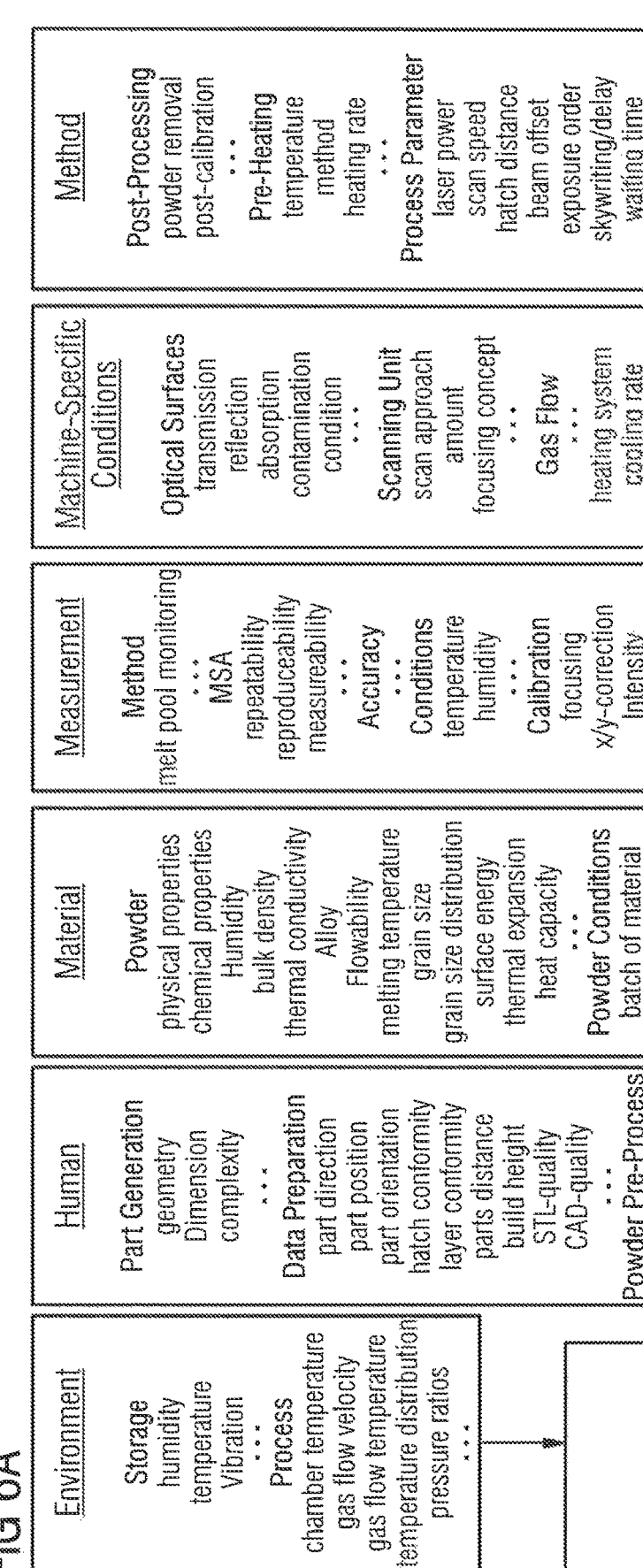

Environment

Storage
 humidity
 temperature
 Vibration
 ...
Process
 chamber temperature
 gas flow velocity
 gas flow temperature
 temperature distribution
 pressure ratios
 ...

Human

Part Generation
 geometry
 Dimension
 complexity
 ...
Data Preparation
 part direction
 part position
 part orientation
 hatch conformity
 layer conformity
 parts distance
 build height
 STL-quality
 CAD-quality
 ...
Powder Pre-Process

Material

Powder
 physical properties
 chemical properties
 Humidity
 bulk density
 thermal conductivity
 Alloy
 Flowability
 melting temperature
 grain size
 grain size distribution
 surface energy
 thermal expansion
 heat capacity
 ...
Powder Conditions
 batch of material

Measurement

Method
 melt pool monitoring
 ...
 MSA
 repeatability
 reproduceability
 measureability
 ...
Accuracy
 ...
Conditions
 temperature
 humidity
 ...
Calibration
 focusing
 x/y-correction
 Intensity

Machine-Specific Conditions

Optical Surfaces
 transmission
 reflection
 absorption
 contamination
 condition
 ...
Scanning Unit
 scan approach
 amount
 focusing concept
 ...
Gas Flow
 heating system
 cooling rate

Method

Post-Processing
 powder removal
 post-calibration
 ...
Pre-Heating
 temperature
 method
 heating rate
 ...
Process Parameter
 laser power
 scan speed
 hatch distance
 beam offset
 exposure order
 skywriting/delay
 waiting time

Figures 14, 15:
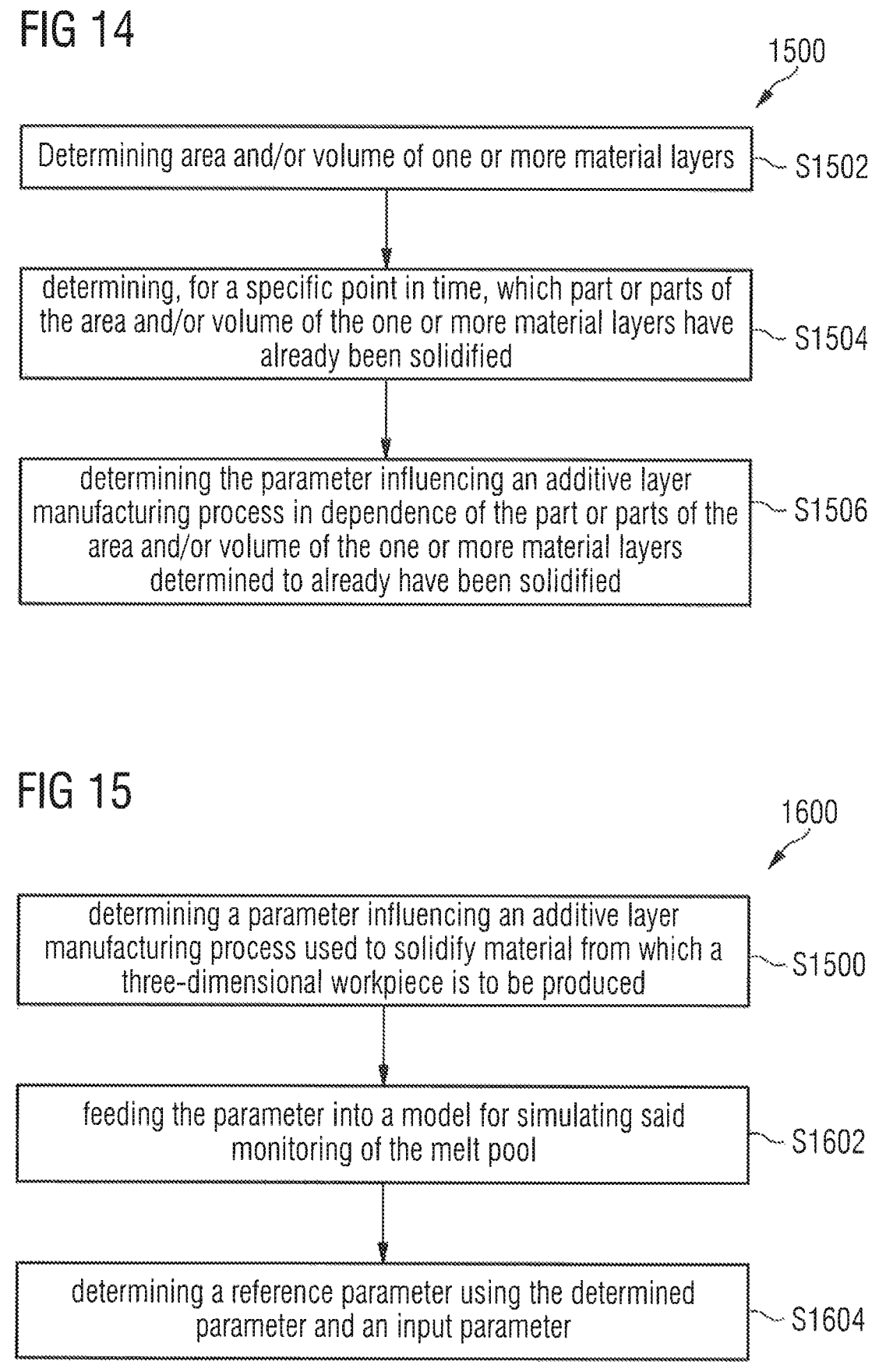

| Determining area and/or volume of one or more material layers | ~ S1502 |

| determining, for a specific point in time, which part or parts of the area and/or volume of the one or more material layers have already been solidified | ~ S1504 |

| determining the parameter influencing an additive layer manufacturing process in dependence of the part or parts of the area and/or volume of the one or more material layers determined to already have been solidified | ~ S1506 |

| determining a parameter influencing an additive layer manufacturing process used to solidify material from which a three-dimensional workpiece is to be produced | ~ S1500 |

| feeding the parameter into a model for simulating said monitoring of the melt pool | ~ S1602 |

| determining a reference parameter using the determined parameter and an input parameter | ~ S1604 |

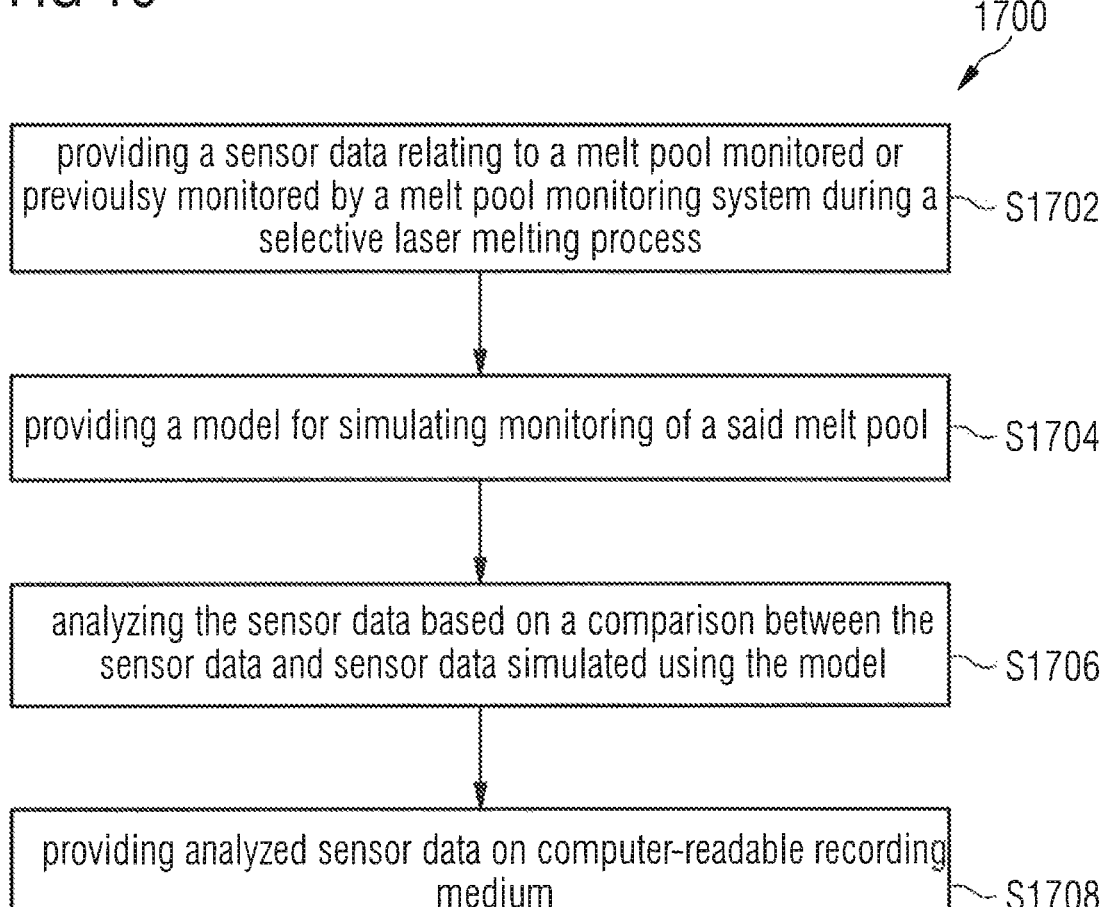

providing a sensor data relating to a melt pool monitored or previoulsy monitored by a melt pool monitoring system during a selective laser melting process ~ S1702 providing a model for simulating monitoring of a said melt pool ~ S1704 analyzing the sensor data based on a comparison between the sensor data and sensor data simulated using the model ~ S1706 providing analyzed sensor data on computer-readable recording medium ~ S1708

SYSTEMS AND METHODS FOR SIMULATING PROCESS MONITORING

CROSS-REFERENCE TO RELATED APPLICATIONS

This application is the U.S. national phase of international application PCT/EP2021/055711, filed on Mar. 8, 2021, which claims the benefit of German application DE 10 2020 109 100.1 filed on Apr. 1, 2020; all of which are hereby incorporated herein in their entirety by reference.

The present invention generally relates to a system for simulating monitoring of a process (e.g. melt pool) by a sensor system (e.g. melt pool monitoring system) in an additive layer manufacturing (in particular selective laser melting) process used to solidify material from which a three-dimensional workpiece is to be produced; a computer program product comprising program code portions for simulating, using the model generated using the system, monitoring of a process by a sensor system in an additive layer manufacturing process; a method for determining a parameter influencing an additive layer manufacturing process used to solidify material from which a three-dimensional workpiece is to be produced; a method for simulating monitoring of a process by a sensor system in an additive layer manufacturing process used to solidify material from which a three-dimensional workpiece is to be produced; an apparatus for producing a three-dimensional workpiece via an additive layer construction method; a method for analyzing sensor data based on a comparison between the sensor data and sensor data simulated using the model; a method for providing sensor data analyzed using the aforesaid method(s); a computer-readable recording medium having stored thereon sensor data analyzed according to the aforesaid method(s); and a neural network for modeling an in-situ process (e.g. melt pool) monitoring system for additive layer manufacturing.

In additive layering methods, workpieces are produced layer-by-layer by generating a sequence of solidified and interconnected workpiece layers. These processes may be distinguished by the type of raw material and/or the way of solidifying said raw material in order to produce the workpiece.

For example, powder bed fusion is a kind of additive layering process by which pul-verulent, in particular metallic and/or ceramic raw materials, can be processed to three-dimensional workpieces of complex shapes. To that end, a raw material powder layer is applied onto a carrier and subjected to, for example, electron or laser radiation in a site selective manner in dependence on the desired geometry of the workpiece that is to be produced. The radiation penetrating into the powder layer causes heating and consequently melting or sintering of the raw material powder particles. Further raw material powder layers are then applied successively to the layer on the carrier that has already been subjected to radiation treatment, until the workpiece has the desired shape and size. Selective electron beam melting, selective laser melting or laser sintering can be used in particular for the production of prototypes, tools, replacement parts or medical prostheses, such as, for example, dental or orthopaedic prostheses, on the basis of CAD data.

Throughout the present disclosure, any references to selective laser melting are equally applicable to selective laser sintering, selective electron beam melting, stereolitography, MELATO, Selective Heat Sintering or any other energy beam based additive processing method. Hence, any references to additive layer manufacturing may be appli-cable to one or more of selective laser melting, selective laser sintering, selective electron beam melting, stereolitography, MELATO, Selective Heat Sintering and any other energy beam-based additive processing method.

An important parameter of additive layer construction methods is the quality of the produced workpieces. Moreover, production efficiency is crucial, e.g. in the sense of keeping production cycles as short as possible. For example, numerous strategies are known for speeding up the production of single workpiece layers. However, when producing large workpieces, known solutions do not always achieve the desired efficiency and/or quality.

Additive Manufacturing (AM) involves numerous and complex variables to be monitored and controlled in the process to achieve an acceptable quality of the printed parts. A common approach to process monitoring is the measurement of melt pool characteristics. Analyzing the characteristics can be complicated due to the amount of data that is collected and unknown influences of process parameters and part geometries.

After more than two decades of development, metal AM established in industrial production environment for highly demanding markets e.g. automotive, aerospace or energy based on increasingly better productivity, repeatability and reliability. In addition to all known technological advantages such as a high degree of geometrical freedom and the possibility to create various geometrical features, the potential of cost savings through part redesign and the application of lightweight constructions methods or higher part performance due to optimized fluid properties or stress reduction, the end user industry require solutions how to document the entire build process and how to ensure the part quality not only but just because of highly-stressed parts for safety-related applications. Selective Laser Melting includes numerous and complex variables like build part placement and orientation, process parameters as well as machine and environmental condition makes it challenging to ensure stabile and reliable conditions, to produce final parts with repeatable quality features which reach their assumed quality requirements.

Various quality assurance methods and techniques, which are working on- or off-axis, are in place or under development in state of the art commercial available and industrialized metal AM machines and new approaches are continually being driven forward in the scientific environment to monitor and/or document irregularities, which can effect part quality during the build job.

It is therefore an object of the present invention in particular to improve quality of the three-dimensional workpiece produced using an additive layer manufacturing process. It is further an object of the present invention to simulate an additive layer manufacturing process to thereby adapt the process to improve quality of the three-dimensional workpiece. It is further an object of the present invention to determine parameters which influence the additive layer manufacturing process to a predefined degree.

We therefore describe a system for simulating process monitoring by a sensor system in an additive layer manufacturing, in particular selective laser melting, process used to solidify material from which a three-dimensional workpiece is to be produced, wherein the system comprises: a data input coupleable to a data output of the sensor system and configured to receive, from the sensor system, sensor data relating to the process monitored by the sensor system, wherein the data input is further configured to receive one or more input parameters (i) relating to the additive layer manufacturing process and/or (ii) associated with an additive layer manufacturing apparatus used for the additive layer manufacturing process and/or (iii) associated with the process monitoring and/or the sensor system; and a processing unit coupled to the data input and configured to generate, from the sensor data and the one or more input parameters, a model for simulating said process monitoring.

The inventor has realized that while a common approach to process monitoring is the measurement in-situ (for example melt pool) characteristics via for example thermal radiations, analyzing the data, especially the characteristics without having further knowledge about the system behavior can be complicated or is even not possible due to the amount of data that is collected and unknown influences of process parameters and part geometries of the three-dimensional workpiece.

Example implementations of the systems (and methods) as described herein allow in particular for in-situ monitoring of a process (for example melt pool) and taking actions during the additive layer manufacturing process (for example selective laser melting process) or even before a certain layer of the three-dimensional workpiece is produced in order to improve quality of the three-dimensional workpiece. The system is hereby configured to simulate monitoring of a process (for example melt pool) in dependence on particular of process parameters relating to the additive layer manufacturing process and/or (ii) associated with a additive layer manufacturing apparatus used for the additive layer manufacturing process and/or (iii) associated with the process monitoring and/or the sensor system.

Throughout the present disclosure, the melt pool may be defined as material which is heated during the additive layer manufacturing process to such an extent that the material (which may, for example, originally be in the form of a powder, in particular a metal powder) melts so as to be in a liquid state.

The sensor system may comprises, for example, one or more cameras.

Example implementations as described herein may additionally or alternatively to the melt pool be used for monitoring/simulating smoke and/or debris and/or splashes, whose trajectory and precipitation locations in the powder bed may be monitored/simulated during the exposure of one layer, which can interfere with direct irradiation on the one hand, as well as influence the exposure of the following layer through partial retention of the splashes in the powder bed on the other hand.

Additionally or alternatively, monitoring/simulating may relate to the layer application (or image is taken after application of the layer and before exposure via the laser), in which on the one hand disturbances in the uniformity of the layer as well as deviations in the workpiece structure can be detected (if the power is applied incorrectly, solidified areas can, for example, be elevated overall or show local elevations (e.g. due to melt ejection at the molten bath)), and on the other hand, conclusions can be drawn about the layer just exposed and the local layer thickness by means of thermographic images.

In some examples of the system, the process monitoring comprises a monitoring of a melt pool, the sensor system comprises a melt pool monitoring system and the model for simulating said process monitoring comprises a model for simulating said monitoring of the melt pool, and wherein the sensor data relating to the melt pool monitored by the melt pool monitoring system comprises sensor data associated with one or more of: a property of the melt pool; radiation originating from the melt pool, in particular thermal radiation or bremsstrahlung originating from the melt pool or an area surrounding the melt pool or following the melt pool; radiation originating from solidified material (which may be comprised in or be identical to the area surrounding the melt pool or following the melt pool); a property of a plasma stemming from the additive layer manufacturing process used to generate the melt pool, the plasma originating from material evaporated from the melt pool; radiation originating from the plasma, in particular thermal radiation originating from the plasma; and radiation reflected and/or diffracted from the melt pool and/or the plasma, in particular laser radiation stemming from a laser used to generate the melt pool. These may be taken into account when feeding the data input of the system with one of more input parameters, so as for the processing unit of the system to generate the model based on the sensor data and the one or more input parameters. Taking one or more of a property of the melt pool, radiation originating from the melt pool, in particular thermal radiation or bremsstrahlung originating from the melt pool or an area surrounding the melt pool or following the melt pool, radiation originating from solidified material, a property of a plasma stemming from the additive layer manufacturing process used to generate the melt pool, the plasma originating from material evaporated from the melt pool, radiation originating from the plasma, in particular thermal radiation originating from the plasma, and radiation reflected and/or diffracted from the melt pool and/or the plasma, in particular laser radiation stemming from a laser used to generate the melt pool into account may allow for an improved model being generated by the processing unit, which may be taken into consideration when preparing the three-dimensional workpiece so as to improve quality of the workpiece.

In some examples of the system, the one or more input parameters relate to or are calculated based on a distribution and/or an arrangement of areas and/or volumes of non-solidified material and solidified material relative to each other in a detection range of the sensor system. Additionally or alternatively, the one or more input parameters relate to or are calculated based on a ratio between non-solidified material and solidified material in the detection range of the sensor system, in particular wherein the ratio between non-solidified material and solidified material in the detection range comprises a ratio between non-solidified material and solidified material in the detection range in a predefined number of (one or more) material layers. Nonsolidified material within the meaning of the present disclosure may be defined as material that has not been irradiated by an energy/irradiation beam, although it is understood that the material can, in some examples, be present in solid condition, i.e. as powder, foils or sheets. Solidified material in contrast may be defined according to the present disclosure as material irradiated by an energy/irradiation beam to melt the material and afterwards solidify as part of the workpiece. Additionally or alternatively, the one or more input parameters comprise one or more parameters defining a location of solidified or non-solidified material within the detection range of the sensor system. Properties such as thermal conductivity, radiation properties and temperature of the detection area may be taken into account when generating the model, which properties may be determined by the allocation, the distribution and the arrangement of the solidified and the non-solidified material relative to each other. These parameters may differ between solidified and non-solidified material. This may in particular allow for improving the model so as to improve quality of the three-dimensional workpiece to be produced when the simulation based on the model is used to adapt the additive layer manufacturing process.

Therefore, in some examples of the system, the one or more input parameters comprise one or more of a thermal conductivity, a radiation property, a temperature of the non-solidified material and a temperature of the solidified material, respectively, in the detection range of the sensor system. Additionally or alternatively, the one or more input parameters comprise a temperature-dependent quotient of the intensities of two wavelength spectra.

In some examples, the system is configured to calculate the one or more input parameters as a function of time. This may allow in particular for adapting the model for simulating monitoring of the process in-situ during the additive layer manufacturing process, thereby improving the model by taking the current circumstances into account, which may ultimately result in improved quality of the three-dimensional workpiece.

In some examples, the system is configured to calculate the one or more input parameters for a defined material layer based on one or more output parameters output based on a said simulation for one or more material layers lying below the defined material layer. Taking into account a simulation for one or more material layers lying below the defined material layer, the model can be improved for the defined material layer based on one of more properties relating to the simulated one or more material layers lying below the defined material layer. The properties of the defined material layer may in particular be dependent from the properties of the one or more material layers lying below the defined material layer.

In some examples, the system is configured to calculate the one or more input parameters for a first plurality of material layers based on one or more output parameters output based on a said simulation for a second plurality of materials layers lying below the first plurality of material layers. Taking into account a simulation for a second plurality of material layers lying below the first plurality of material layers, the model can be improved for the first plurality of material layers based on one of more properties relating to the simulated second plurality of material layers. In particular, calculating the one or more input parameters for a first plurality of material layers may further improve efficiency for generating the model for various material layers.

In some examples, the system is configured to calculate the one or more input parameters for a said material layer or plurality of material layers based on one or more parameters indicating when one or more lower-lying layers were or have been irradiated. This may be particularly advantageous as radiation properties of the one more lower-lying layers are dependent on the time which has elapsed since the lower-lying layers were irradiated and/or on the time period of how long the lower-lying layers were or have been irradiated. The generated model may hereby be improved for the material layer to which the model is applied.

In some examples, the one or more parameters indicating when the one or more lower-lying layers were or have been irradiated are location-dependent parameters. This may allow for further improving the model based on these one or more location-dependent parameters.

In some examples of the system, the one or more input parameters comprise one or more of a radiation beam power (for example laser power), a scan speed of a radiation beam used in the additive layer manufacturing process, a hatch distance used in the additive layer manufacturing process, and a material layer thickness of the material. This may improve the generated model as these input parameters may, in some examples, significantly influence measurement signals of the process monitoring.

In some examples, the one or more input parameters relate to or comprise one or more of: a radiation (for example laser) beam diameter; a heat dissipation during the additive layer manufacturing process; a physical property of the material to be solidified; an optical surface and/or a scanning unit and/or a laser and/or a layer depositing unit of the additive layer manufacturing apparatus and/or a gas flow and/or a temperature distribution within the additive layer manufacturing apparatus; and a scan strategy used in the additive layer manufacturing process, in particular a position of the radiation beam on a layer of the material and/or a deflection angle of the radiation beam and/or a vector angle and/or vector length of a vector for scanning the radiation beam across the material layer and/or a scanning direction for scanning the radiation beam across the material layer with respect to a gas flow direction.

In some examples of the system, the processing unit comprises an artificial neural network, and wherein said generation of the model comprises: generating a data set comprising the sensor data and the one or more input parameters; dividing the data set into a test data set and a training data set; selecting a neural network model for the artificial neural network; training the artificial neural network based on the neural network model using the training data set; and evaluating the neural network model using the test data set. A machine learning algorithm based on an artificial neuronal network (ANN) to simulate, analyze and evaluate the data of the used in-situ sensor (for example melt pool monitoring (MPM)) system may allow for efficiently analyzing the data of the process monitoring, even for a large amount of data which may be collected.

In some examples of the system, said evaluation comprises: defining a requirement for the artificial neural network; and if a metric associated with the artificial neural network does not fulfill the requirement, changing a structure and/or topology of the artificial neural network until the requirement is fulfilled. The structure and/or topology of the artificial neural network may hereby be improved for the specific use case of the model applied to simulate monitoring of the process (e.g. melt pool). The generation of the model may comprise training the artificial neural network based on the changed structure and/or topology of the artificial neural network.

In some examples, the system is configured to simulate sensor data which is output by the sensor system based on the model and the one or more input parameters. The sensor data which is output by the sensor system may comprise the sensor data used to generate, by the processing unit, the model and/or sensor data which is output by the sensor system after the model has been generated. The simulated sensor data may then advantageously subsequently be used in order to adapt the additive layer manufacturing process.

In some examples, the system is configured to: compare the sensor data which is output by the sensor system with the simulated sensor data; and detect an anomaly and/or process error during the additive layer manufacturing process based on said comparison. Additionally or alternatively, an anomaly and/or process error may be determined based on the comparison even prior to the additive layer manufacturing process being conducted.

In some examples, the system is configured to perform said comparison in-situ during the additive layer manufacturing process. This may advantageously allow for adapting the additive layer manufacturing process in-situ, when required.

In some examples, the system is configured to provide, based on said comparison, a signal to the additive layer manufacturing apparatus to adapt the current additive layer manufacturing process, in particular by stopping the current additive layer manufacturing process. This may allow in particular for adapting the parameters for the additive layer manufacturing process so as to ultimately improve quality of the three-dimensional workpiece to be produced. Depending on the measured parameters, for example an automatic adjustment of the parameters or just a suggestion for a change can be made. In addition or alternatively, a partial cancellation of a construction process would also be possible, for example individual components could be cancelled in an order with several components.

In some examples, the system is configured to generate a database comprising the generated model for subsequent use in a said simulation. The generated model in the database may be updated so as to improve performance of the model for one or more use cases.

In some examples, the system is further configured to adapt, based on the simulation model, a process parameter for the additive layer manufacturing process and/or a geometry of the three-dimensional workpiece produced using the additive layer manufacturing process. This may advantageously allow in particular for intervening the current process and/or changing the anticipated geometry of the three-dimensional workpiece to adapt the process and/or geometry to ultimately improve quality of the workpiece. This could be for example an automatic adjustment of the geometry or just a suggestion for a change. It is also possible that an optimized geometry is suggested even before the start of production.

In some examples of the system, the training of the artificial neural network is based on minimizing a mean absolute error between the sensor data and simulation data relating to said simulation of the monitoring of the process. Quality of the three-dimensional workpiece may thus be improved.

In some examples, the training of the artificial neural network is based on a plurality of topologies of the artificial neural network, and wherein each of the topologies differs from the other topologies by a number of hidden layers and/or a number of neurons per hidden layer. The optimal topology for the artificial neural network for the specific use case made thus be found for improving generating the model used for simulating monitoring of the process.

In some examples, the system is configured to train the topologies of the artificial neural network until a minimum mean absolute error is reached, which may allow for minimizing any anomalies of the three-dimensional workpiece and/or process errors when producing the three-dimensional workpiece.

In some examples, the artificial neural network comprises a multidimensional artificial neural network. This may be particularly advantageous in order to adequately address the geometry of the three-dimensional workpiece to be produced.

We further describe a computer program product comprising program code portions for simulating, using the model generated using the system according to any one of the example implementations as described herein, monitoring of a process (e.g. melt pool) by a sensor system (e.g. melt pool monitoring system) in an additive layer manufacturing process. The computer program product may in particular be stored on a computer-readable recording medium.

We further describe a method for determining a parameter influencing an additive layer manufacturing process used to solidify material from which a three-dimensional workpiece is to be produced, the method comprising: determining an area and/or a volume of one or more material layers; determining, for a specific point in time, which part or parts of the area and/or volume of the one or more material layers have already been solidified; and determining the parameter influencing an additive layer manufacturing process in dependence of the part or parts of the area and/or volume of the one or more material layers determined to already have been solidified. The parameter may then be used, for example, when generating the model used for simulating monitoring of the process. As outlined above, solidified and non-solidified material may have different properties, in particular heat dissipation properties, which may thus be taken into account when generating the model.

In some examples, the parameter is determined based on a first ratio, for the specific point in time, between solidified and non-solidified material in the (two-dimensional) area and/or in the volume. The first ratio may hereby refer to the ratio between the quantity of solidified material and the quantity of non-solidified material, respectively. Additionally or alternatively, in some examples, the parameter is determined based on a second ratio, for the specific point in time, between solidified material and material to be solidified in the area and/or in the volume in order to produce the three-dimensional workpiece.

In some examples, the parameter is determined based on a location of previously solidified material in the area and/or in the volume. It may hereby be taken into account whether the location is, for example, close to an edge region of, for example, a detection region of a sensor system, or whether the location is more centered within the detection region.

In some examples, the area and/or volume are larger than an area and/or volume, respectively, in which the three-dimensional workpiece is to be produced in a specific point in time using the additive layer manufacturing process, in particular larger than an area and/or volume of a melt pool.

We further describe a method for simulating monitoring of a process (e.g. melt pool) by a sensor system (e.g. melt pool monitoring system) in an additive layer manufacturing process used to solidify material from which a three-dimensional workpiece is to be produced, the method comprising: determining a parameter using the method according to any one of the aforesaid example implementations; and feeding the parameter into a model for simulating said monitoring of the process. The model may hereby be particularly precise in view of a parameter being used when generating the model, whereby the parameter is determined in dependence of the part or parts of the area and/or volume of the one or more material layers determined to already have been solidified.

In some examples, the method further comprises determining a reference parameter using the determined parameter and an input parameter, wherein the input parameter comprises one or more of: a parameter relating to an environment of an apparatus used for the additive layer manufacturing process, a parameter relating to a physical property of the material to be solidified, a parameter relating to the process monitoring, a parameter relating to the apparatus used for the additive layer manufacturing process, and a parameter relating to the additive layer manufacturing process; and wherein the method further comprises interpreting a sensor signal output by the sensor system using the reference parameter. In some examples, the reference parameter is determined using an artificial neural network. An input for the artificial neural network may comprise one or more constants and/or one or more one-dimensional time series. The artificial neural network may hereby allow for processing large amounts of data.

In some examples, the sensor signal is used (i) to determine a parameter influencing the additive layer manufacturing process, and/or (ii) as a said input parameter for the artificial neural network. A loop may therefore be performed so as to improve the artificial neural network for the use case and/or a model used for simulating monitoring of a process.

We further describe a computer program product comprising program code portions for performing the method according to any one of the aforesaid example implementations when the computer program product is executed on one or more computing devices. The computer program product may in particular be stored on a computer-readable recording medium.

We further describe an apparatus for producing a three-dimensional workpiece via an additive layer construction (i.e. manufacturing) method, the apparatus comprising: a carrier configured to receive material for producing the three-dimensional workpiece; a material supply unit configured to supply material to the carrier and/or preceding material layers on top of the carrier, a layer depositing mechanism for forming the supplied material into a material layer on top of the carrier and/or the preceding material layers on top of the carrier, a solidification device configured to solidify the material supplied to the carrier and/or the preceding material layers on top of the carrier for producing the three-dimensional workpiece, a gas supply unit configured to supply a shielding gas to an area of the material layer that is to be solidified by the solidification device, a process chamber comprising the gas supply unit and the solidification device, a monitoring system for monitoring an area in which the material is solidified, and a system for simulating monitoring of a process according to any one of the example implementations as described herein. In some examples, the apparatus further comprises the computer program product according to any one of the example implementations as described herein.

We further describe a method comprising: providing sensor data relating to a process monitored or previously monitored by a sensor system during an additive layer manufacturing process; providing a model for simulating monitoring of a said process, the model (i) being generated using the system according to any one of the example implementations as described herein, and/or (ii) being provided via a computer program product according to any one of the example implementations as described herein, and/or (iii) being generated using a parameter determined according to any one of the example implementations as described herein; wherein the method further comprises analyzing the sensor data based on a comparison between the sensor data and sensor data simulated using the model.

In some examples, the sensor data relating to the process monitored by the sensor system comprises sensor data associated with one or more of: a property of a melt pool; radiation originating from the melt pool, in particular thermal radiation originating from the melt pool; radiation originating from solidified material; a property of a plasma stemming from the additive layer manufacturing process used to generate the melt pool, the plasma originating from material evaporated from the melt pool; radiation originating from the plasma, in particular thermal radiation originating from the plasma; and radiation reflected and/or diffracted from the melt pool and/or the plasma, in particular laser radiation stemming from a laser used to generate the melt pool.

We further describe a method comprising providing sensor data analyzed using the method according to any one of the aforesaid example implementations.

We further describe a computer-readable recording medium having stored thereon sensor data analyzed according to the method according to any one of the aforesaid example implementations.

These and other aspects of the invention will now be further described, by way of example only, with reference to the accompanying figures, wherein like reference numerals refer to like parts, and in which:

FIG. 14 shows a method for determining a parameter influencing an additive layer manufacturing process according to some example implementations as described herein;

FIG. 15 shows a method for determining a reference parameter using the determined parameter and an input parameter according to some example implementations as described herein; and FIG. 16 shows a method for providing analyzed sensor data on a computer-readable recording medium according to some example implementations as described herein.

One of the main challenges in the industrial application of the Selective Laser Melting process (or generally in additive layer manufacturing) is the unstable component quality, process stability and reproducibility. The reasons for these are diverse and versatile interaction mechanisms and cause-and-effect principles, which cannot always be clearly traced back due to their complexity and which can also change during the course of a production process.

Therefore, sensor and monitoring systems are increasingly used for quality assurance and documentation of the production process.

Figure 1:
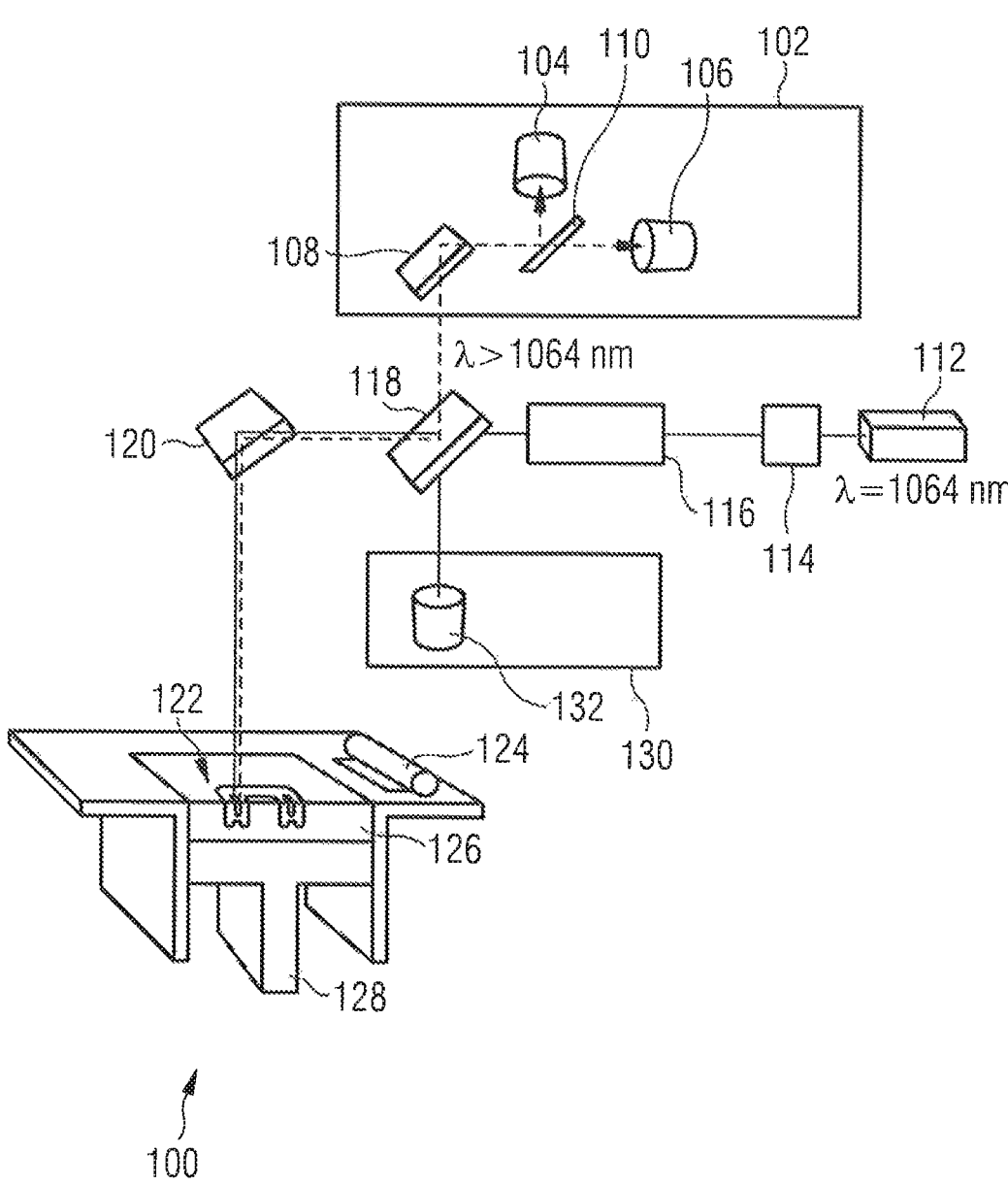
FIG. 1 shows a schematic illustration of an apparatus for producing a three-dimensional workpiece according to some example implementations as described herein.

FIG. 1 shows a schematic illustration of an apparatus 100 for producing a three-dimensional workpiece according to example implementations as described herein.

In this example, the apparatus 100 comprises a melt pool monitoring device or system 102 for monitoring a melt pool, which, in this example, comprises a first photodiode 104 and a second photodiode 106, a beam splitter 110 and a mirror 108. The beam splitter 110 could divide incoming radiation in dependence of different wavelengths.

The apparatus 100 further comprises a laser power monitoring device or system 130 for monitoring a laser power. In this example, the laser power monitoring device or system 130 comprises a photodiode 132.

A laser beam with a wavelength of, in this example, 1064 nm is generated using laser 112. The laser beam is, in this example, collimated using collimator 114. The collimated laser beam passes through a 3D-focusing unit 116 before it reaches a beam splitter 118, where the laser beam on the one hand travels towards the laser power monitoring device or system 130, and on the other hand via scanner 120 towards the build chamber 122. Although not shown, it is clear that additional beam forming elements, i.e. additional focusing elements, or beam steering elements, i.e. additional scanning mirrors, could be present anywhere in the beam path. Moreover elements not influencing the laser beam like an entry window to the build chamber could be present.

The wavelength of the radiation monitoring by the melt pool monitoring device or system 102 is in this example greater than the laser beam wavelength, here 1064 nm. In another example a wavelength less than the laser beam wavelengths could be used, or also a spectrum including the laser wavelength could be used.

In this example, a powder application unit 124 is provided to apply metal powder 126 on a retractable platform 128.

From the data recorded via the melt pool monitoring system, conclusions are to be drawn which point to irregularities during the melting process and can lead to potential defects in components.

Depending on the component volume, and against the background of constantly increasing plant technology, one or more high-resolution process monitoring systems generate data volumes that are too large and too complex to be evaluated purposefully with manual and conventional methods of data processing.

Some of the example implementations as described herein provide a data-driven approach using machine learning algorithm based on neural networks, to simulate an in-situ melt pool monitoring system, as well as offering some of the use cases for the simulated in-situ melt pool monitoring system. The input features for the system model include, in some examples, process parameters as well as information about the build strategy. With these input features, the model may be trained to predict the usual sensor output of the in-situ melt pool monitoring system. The comparison of recorded and simulated data may enable analysis to identify potential irregularities during fusion that can indicate anomalies during the build based on a reference or is indicating process instabilities.

With a model of the melt pool monitoring or the monitoring system(s), simulated and measured sensor signals may be compared-a reference, not known in this way, created specifically for the application. With this comparison, process fluctuations or instabilities and/or any anomalies or component defects may be detected during the construction process, so that suitable corrective measures may be taken to adjust production parameters in real time, components may be reworked or removed from the further process, or a knowledge database may be fed with the corresponding process events in parallel. On the basis of a well-founded knowledge base, process fluctuations or instabilities and/or any anomalies or component errors may also be taken into account before the manufacturing process, i.e. during the preparation of the manufacturing process, especially during pre-process in the course of an arrangement, orientation and transfer of corresponding manufacturing parameters of a manufacturing process, i.e. of a component or a multitude of components. This may increase the quality of the manufactured components, as well as economic efficiency of the machines with regard to material consumption, production time or downstream post-processing procedures and potentially the destructive or non-destructive material testing that is no longer necessary. In order to do justice to the industry's requirement of the "first-time-right" principle (i.e. the workpiece is produced to a certain quality from the outset of the manufacturing process), it may be advantageous to simulate the process. With a simulation model of the melt pool monitoring or a corresponding arrangement of further or a multitude of monitoring systems, it may be possible to optimize the target parameters such as production time or quality even before the actual production process, depending on process parameters or component/workpiece geometry. This is done in contrast to commercially available simulation applications of, for example, thermal simulation, here on the basis of the in-situ process monitoring used, since real process data serve as a basis for modeling or simulation. With a simulation model of the MPM, process parameters or part geometries can already be optimized with regard to the thermal load before the actual construction process.

An objective of the present disclosure is based on the identification of not further defined process stabilities as well as on the identification of local anomalies. Definition of process stabilities could be dependent on given quality requirements. Considering the intensive examination of the system as well as the signal characteristics, both this superordinate idea (method) and a part of the applied input variables of the neural network can be developed using systems and method as described herein.

If process monitoring systems from today indicate irregularities, most of the data or analysis is available after (offline) the entire build job. The goal according to example implementations as described herein is to identify conditions or part irregularities before cost and time effective post-processing non-destructive testing (NDT) methods, especially computer tomography (CT), have to be used for all final parts. Reliable quality indicators may be needed which may be available during the process (online) to have the ability to use further control approaches, deleting single parts of a job or forwarding and using this information for partial NDT post-processing. The present disclosure addresses the development, implementation and evaluation of, in particular, artificial neural networks (NN) for modeling the MPM. For this purpose, it may be necessary to determine all relevant physical input parameters. With regard to the input and output parameters of the model, a suitable NN may need to be selected and a corresponding topology developed. Pre-processed data may be used to train and test the implemented NN. The aim is to develop a sufficiently precise input-output model, which allows a comparison of the simulated and measured sensor signal, independent of the geometry of the manufactured component/workpiece. The comparison may then be used to detect signal anomalies and process variations that will be correlated with quality characteristics of components in the future.

As will be appreciated by those with skill in the art, bid data refers to amounts of data that are too large, too complex, too fast moving or too weakly structured, for example, to be evaluated using manual and conventional data processing methods. Artificial Intelligence (AI) refers to all technologies used in connection with the provision of intelligence services that were previously reserved for humans. "Machine Learning" (MI), "Deep Learning" (DL), "Natural Language Processing" (NLP) and "Neural Networks" (NN) are corresponding subareas of AI, partly sub-areas within these sub-areas. Artificial neural networks (ANN) have been used for scientific applications for several decades. In recent years, however, major advances in hardware for parallel computing and the availability of massive data sets have led to an increase in the popularity of NNs for many applications in different domains. Given the architectural flexibility of NNs, they can be tailored to specific requirements and trained for many different applications. An ANN is a mathematical model that simulates information processing in biological NNs. The mathematical mapping of nerve cells and thus the development of ANNs can be traced back to fundamental work known in the art.

Figure 2:
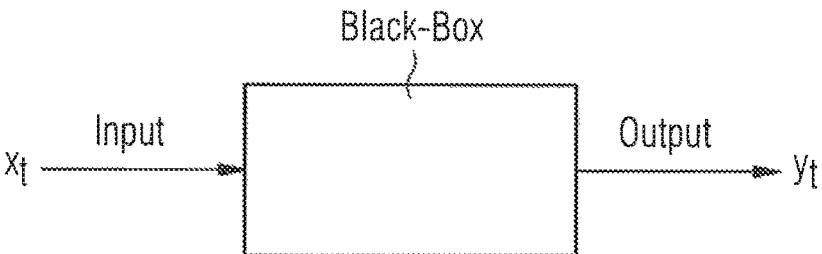
FIG. 2 shows a model of a technical system as a Black-Box according to some example implementations as described herein.

In relation to system modeling by neural networks, the modeling of a technical system generally aims at understanding the cause-effect principle of the real system and to represent it mathematically. Such systems are also referred to as Black-Boxes, for the identification of which only the input and output variables can be used, which is shown in FIG. 2. In terms of Artificial Intelligence and Machine Learning Black-Box-Models are understood as being from statistical nature in contrast to White-Box-Models being based on analytical and physically descriptions and therefore highly complex. Grey-Box-Models are combining these approaches. Although all three models might be used for the object of the invention, the Black-Box being the most preferred, and the White-Box being the less preferred.

The determination of a mathematical model for the system behavior from measurements of the input and output variables is called experimental system identification. ANNs of complex, nonlinear and dynamic systems are suitable as universal approximations. An important feature of these networks is their adaptive nature. By training the ANN with the input and output variables of the real system, the internal parameters of the network are adapted and a system image as accurate as possible is aimed at. The structure of the ANN or the topology may depend on the application and the properties of the system to be modeled. ANNs can be divided into three classes by Multilayer Perceptron (MLP), Recurrent Neural Network (RNN) and Convolutional Neural Network (CNN).

Figure 3:
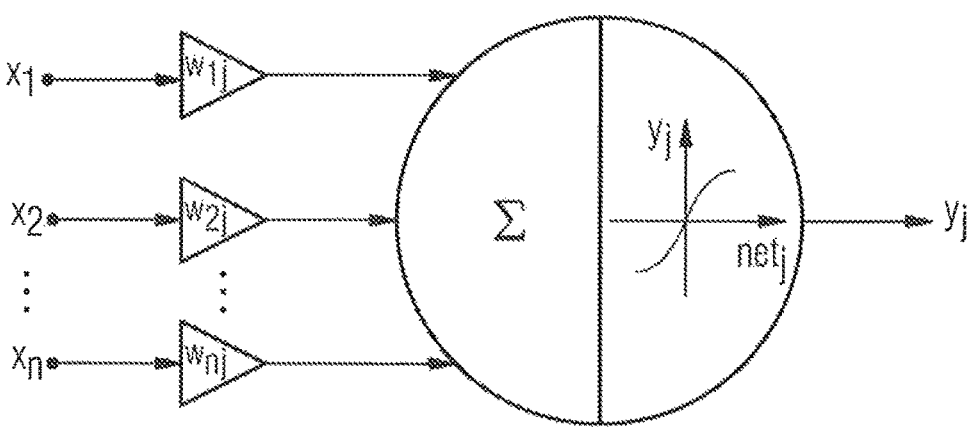
FIG. 3 shows the basic structure of an artificial neuron according to some example implementations as described herein.

Based on the biological nerve cell, the artificial neuron forms the smallest process unit of an ANN. The basic structure of an artificial neuron is shown in FIG. 3.

A neuron y has one or more inputs $x_i$ and one output $y_i$. The weights $w_{ij}$ describe the intensity of the information flow along a link. Depending on the sign of the weights, an entrance can act inhibiting or exciting. At a weight of zero, the connection can be considered non-existent. The propagation function links the weighted inputs to the so-called net input $net_j$, whereby this function usually only forms the sum of the inputs. Other theoretical correlations are possible. The network input of a neuron can therefore be summarized in the following equation:

$$net_j = \sum_{i=1}^{n} x_i * w_{ij}$$

The neuron output is formed from the network input by means of an activation function f, which is often a sigmoid function. Depending on the mesh topology, another non-linear, piecewise linear or jump function can be used. In general, activation functions are monotonously increasing. The neuron output can therefore be described with the following equation:

$$y_j = f(net_j) = f\left(\sum_{i=1}^{n} x_i * w_{ij}\right)$$

An ANN consists of at least one or more parallel neurons. The type or topology of an NN determines how the different neurons are connected. A network consists of at least one input layer and one output layer, typically there are hidden layers between these two layers. The number of neurons in the input layer depends on the number of input parameters to be considered. Depending on the problem, the number of neurons in the output layer can vary.

To reduce the network error, gradient based methods are often used which determine the direction in which the error decreases the fastest, similar to finding the global minimum in a nonlinear equation system such as a cost function. The goal of the training is to minimize the cost function without over-fitting the ANN, so that the ANN does not memorize the training data set and the usual variations in the cost function are avoided such as noise, for example. To solve this problem, training and test sets are used to set the optimum cost function between variance and bias.

Now there are a number of approaches in the development stage in which AI can be used for error detection during process monitoring using Artificial Intelligence for Additive Manufacturing. Most of these approaches differ above all in the sensors used. Pictures may be taken before and after the exposure with a high-resolution reflex camera. After the build process is done, the part is measured using CT and the errors found serve as a reference with which it is then possible to implement a monitored machine learning algorithm which correlates the acquired image data with the CT measurement. The trained algorithm is then able to detect defects in the part only with the image data acquired during the process. Alternatively, the shape of the melt pool is recorded with a high-speed camera limited to a small area in the working plane. Alternatively, the thermal radiation of the melt pool or coaxially a combination of thermal radiation by means of pyrometer and melt pool dynamics by means of a high-speed camera is analyzed and correlated with defects or the mechanical properties of the manufactured components.

The inventor has realized that a large part of the existing work concentrates on the detection and localization of defects in simple cube geometries and can only be transferred to other, more complex component geometries to a limited extent. Frequently the sensors used cannot be integrated into commercial available metal AM machines.

Some of the research presented in the present disclosure was carried out on a SLM 280$^{HL}$ single optic machine with a 80 pm to 115 pm focus diameter and 700 W laser, equipped with a MPM process monitoring system-a coaxial in-situ measurement device based on two photodiodes with and a FPGA working with 100 kHz and a presentation of x/y-coordinates of 16 bit. In the following approach, sensor data of photodiode 1 corresponds to channel 1 and photodiode 2 corresponds to channel 2.

Further detailed information about the machine and optical system setup as well as the hardware, software and measurement principle of the MPM system is published in D. Alberts, D. Schwarze and G. Witt, "High speed melt pool and laser power monitoring for selective laser melting (SLM®)", 9th International Conference on Photonic Technologies, LANE, 2016, https://www.lane-confer-ence.org/app/download/11537198949/LANE2016_1219_Alberts_IC_endformat.pdf?t=1534490222, and in D. Alberts, D. Schwarze and G. Witt, "In situ melt pool monitoring and the correlation to part density of Inconel®718 for quality assurance in selective laser melting", Solid Freeform Fabrication: Proceedings of the 28th Annual International, 2017, pp. 1481-1495.

An official material file developed and validated at that time of IN718 from SLM Solutions Group AG® has been used. Studies resulted in an averaged part density of 99.8% so that the fabricated parts can be used as an almost defect free reference. Boundary conditions e.g. inert gas atmosphere (argon), oxygen content (<0.1%), gas flow velocity, pre-heating temperature (200° C.) or pressure ratios have been monitored over the whole process and have been manufactured under constant conditions with the help of integrated control systems. The used powder material consists of spherical shape with a particle size distribution of 10-45 pm.

Figure 4:
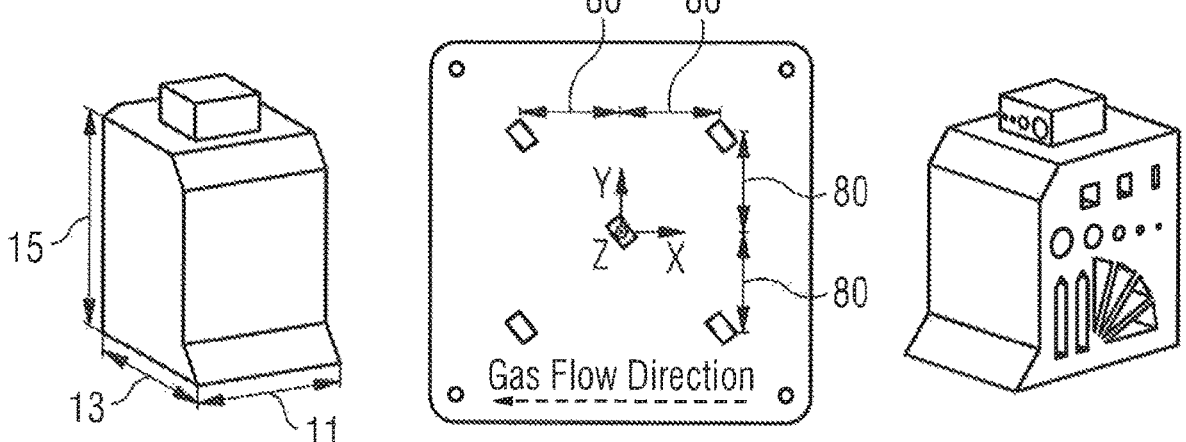
FIG. 4 shows schematic illustrations of part alignment and positioning using a reference cube and a feature cube according to some example implementations as described herein.

For this approach two build jobs, one job with five parts and reference parameters based on a basic cube geometry (Reference Cube) as well as one job with five parts and reference parameters including different geometrical features (Feature Cube), have been produced. The part alignment and positioning is shown in FIG. 4.

The geometric features include vertical, thin and pointed walls or powder inclusions and triangles of different overhangs and opening angles as well as horizontal cylindrical holes with varying diameters and rectangles with various lengths. For each layer, single part exposure has been done from left to right against the gas flow. A bi-directional stripe exposure and a certain angle increment after each layer is used as hatch pattern.

Figure 5:
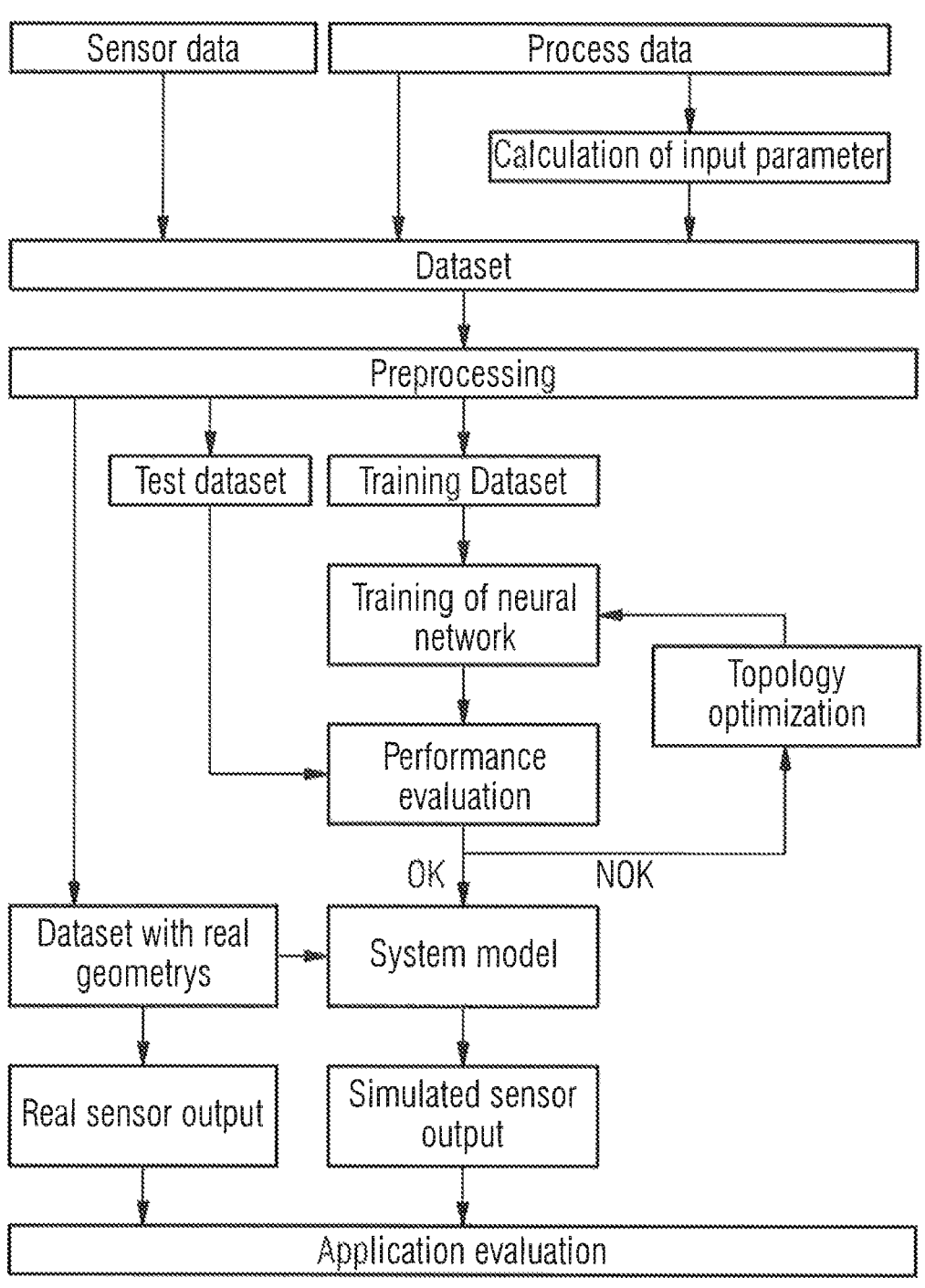
FIG. 5 shows a flow diagram of a method with test and evaluation concept according to some example implementations as described herein.

FIG. 5 shows a flow diagram of a method including test and evaluation concept.

For each layer produced, the MPM generates for example a binary file, which contains the measured values for each measuring cycle and process data of the build process, from which all input parameters relevant for the ANN are then calculated.

A data set (1 to n binary data), consisting of the input data (process data and calcu-lated input parameters) and output data (sensor data from channel 1 and channel 2), forms the basis for training and testing the ANN.

The compiled data set is pre-processed (data with different formats may be converted to have the same format, values may be scaled and boundary values may be defined) and divided into a test data set and a training data set.

During performance evaluation, the test data set is used to test the trained network with data that has not been used for training.

For the performance evaluation, appropriate metrics are used to assess the ANN. If these metrics do not meet the requirements of the system model, the network structure or topology may need to be optimized. The network with the changed topology may then need to be trained and evaluated again. These steps may be repeated until a network topology has been found with which it is possible to map the system behavior of the MPM in the best possible way.

Subsequently, in this example, the system model is evaluated with regard to its suitability as a quality assurance tool in the Selective Laser Melting respectively metal AM process by using a data set of the Feature Cube (in the broadest sense with signal anomalies or process errors, as these are previously unknown). The system model simulates the sensor output based on the input data of the data set used.

The simulated sensor output can then be compared with the real sensor output. The system model is then evaluated for its ability to detect or indicate any signal anomalies and/or process errors.

For another approach, if a geometry dependency is determined, the system model can be extended by training the existing one with a data set from the build process of the Feature Cubes and evaluating the performance.

For the system model to be developed, the overall system, including the architecture or functionality of the MPM and the existing database, may need to be analyzed. Based on this, physically relevant input parameters are identified, a suitable network model is selected for the system model (based on, for example, requirements regarding precision) and the requirements for this network model are defined. Only the in-process is taken into account. Process steps upstream and downstream of the process, as well as the metal powder, are not further considered in this example. The Selective Laser Melting process and the MPM are assumed to be Black-Boxes and only the input and output parameters are considered. The aim of the analysis is to characterize significant influence parameters. Statistically significant may be parameters whose effects are greater than the random scatter.

A melt pool emits heat radiation depending on its temperature, area and position. In this example, the detection range of the two photodiodes is identical and can be assumed circular. The radiation intensities measured in the detection range are interpolated and averaged over a measuring rate of for example 10 us and stored with the current position, which then represents a measurement area. The measured intensity of a vector can vary although the process parameters and thus the temper-ature and the size of the melt pool are (in some examples) approximately constant.

In addition to these intensity variations, there is usually a higher frequency noise. In order to qualitatively estimate the noise in the construction processes used, the sensor values of the build jobs used could be smoothed by means of a moving average value.

Relevant input parameters correspond to influence factors, which is significantly influenced by the measurement signals of the MPM. Process parameters with laser power, hatch distance, layer thickness and scan speed, which have both influence on the part quality and on the measurement data, may be relevant. Fundamental differences between the material to be used and machine-specific conditions may need to be taken into account. Both cause-related negative influences on the part quality and the causes summarized here may be worked out. A changed beam diameter can mean an enlargement of the melt pool and may therefore need to be considered. Another influence is the angle of incidence of the laser, relative to the powder bed under consideration of the scanning direction. In some cases, there may be a minor correlation between the interaction of the laser radiation with metal vapor and the part quality. The scanning direction relative to the gas flow may have an influence on the measurement signal. The exposure of a vector in flow direction means that the heat radiation of the melt pool is shielded by the welding fume and results in a reduction of the measurement signal.

In addition, measurement and geometry dependencies may need to be taken into account, which map properties such as thermal conductivity, radiation properties and temperature of the detection area and are determined by the allocation, the distribution and the arrangement of the solidified and the powder material to each other, the scan strategy and the process parameter. The powder surrounding the part acts as a thermal insulator and has a lower thermal conductivity than molten and solidified metal. Because solidified material and powder material have different emission properties, it is relevant to consider their ratio in the detection range. The temperature of the already solidified material depends on a large number of influences and the heat balance of a layer is characterized by the temporal sequence of the individual scan vectors, the process parameters, the temperature control of the build chamber and the heat dissipation.

In addition to convection and heat radiation, heat dissipation is determined by the heat conduction of the allocation, the distribution and the arrangement of the solidified and the powder material to each other, which will be considered as a geometry dependence input parameter.

Figure 6B:
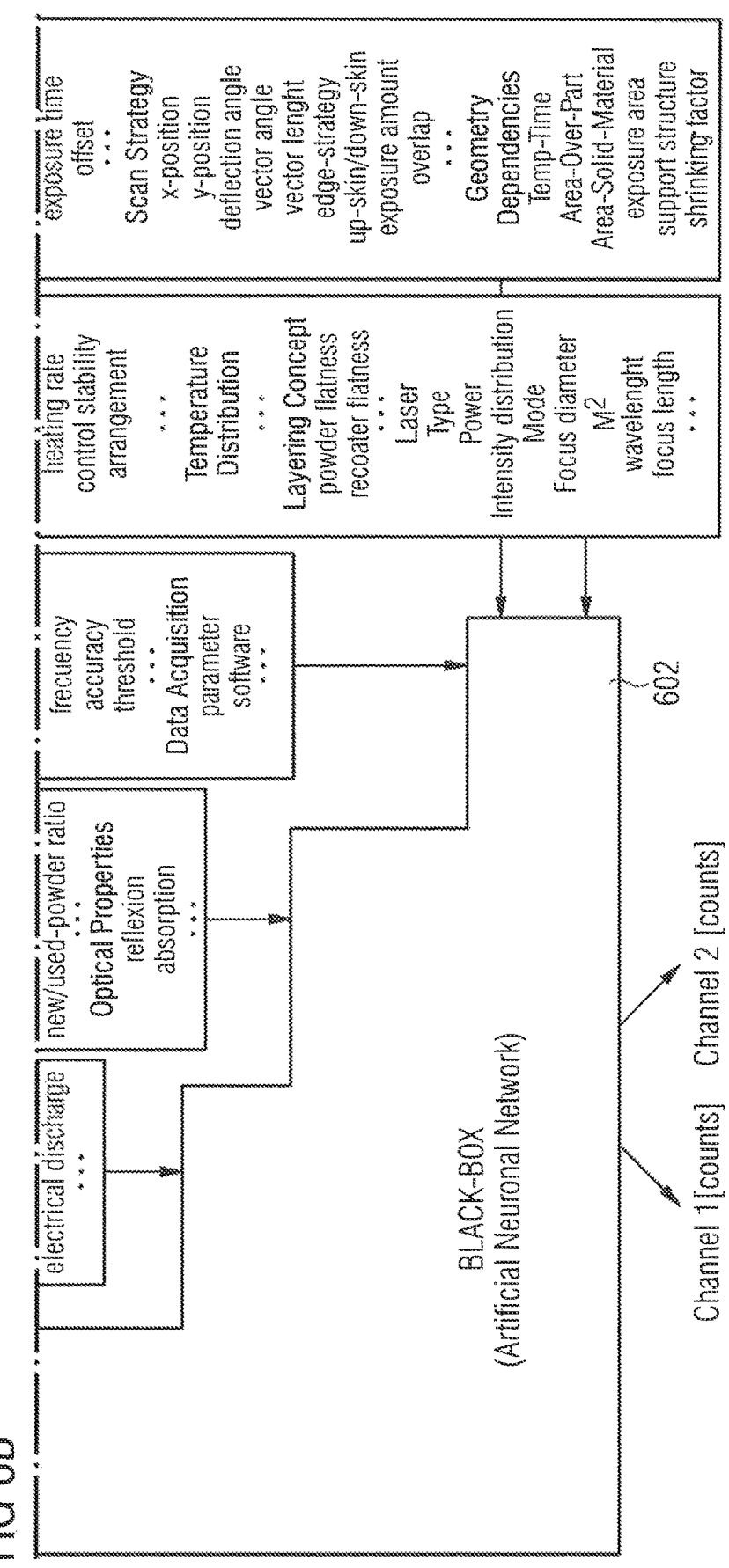
FIG. 6 shows a schematic diagram of a black-box-model with identified input parameters according to some example implementations as described herein.

FIG. 6 gives an overview of the identified input parameters, which are sorted into various groups comprising environment, human-influenced parameters, material, melt-pool measurement, machine-specific conditions, process parameter, scan strategy and geometry dependencies, and illustrates the procedure of experimental modeling on the Black-Box-System using the artificial neural network 602.

Input classes, subclasses, and parameters represent a possible combination of a multitude of differently weighted influencing variables on the quality of a system model, here thermal, to be depicted. The differentiation serves only the structured representation and less the value of individual input parameters.

The input class environment describes the sum of a selection of environmental factors occurring during the manufacturing process. Both the stocking and the process periphery are to be mentioned here.

The input class human describes the sum of a selection of human factors, mainly occurring during the preparation of the manufacturing process.

The input class material describes the sum of a selection of material parameters occurring before, during and after the construction process, with a focus, in this example, on physical, chemical or optical properties as well as on its composition.

The input class measurement describes the sum of a selection of measurement influence quantities, occurring before, during and after the construction process and focusing on the method, measuring equipment capability, accuracy, conditions, calibration and data acquisition.

The input class machine-specific conditions describes the sum of a selection of machine-specific influencing variables, occurring before, during and after the construction process and mainly with regard to the condition and properties of the optical interfaces, the scanner unit, the gas flow, the temperature distribution, the behavior and conditions regarding the powder application as quality parameters of the laser unit used.

The input class method describes the sum of a selection of machine-specific influencing variables occurring before, during and after the construction process. Emphasis is placed, in this example, on the in-process input parameters with the process parameters such as laser power or deflection speed, the scan strategy such as position data or vector lengths or geometry-specific dependencies. These are characterized by space- and time-dependent as well as partly temperature-dependent conditions or results, with or without laser-powder interaction, regarding powder/solid material rate.

In relation to selecting a network model, the ANN may simulate the output parameter based on the given input parameters. In order to simulate this relationship between cause and effect, the ANN may need to be trained. Since the output data for the training are already available, we speak of supervised learning. The problem at hand can be described as a regression problem, since the initial data are continuous variables. Both input and output data are available as one-dimensional time series.

When evaluating performance of the ANN, the ANN is trained, in this example, to minimize a cost function that measures the mean absolute error (MAE)—see following equation—between the simulation $\hat{y}_i$ and the actual sensor output $y_i$ $$MAE = \frac{1}{n}\sum_{i=1}^{n}|y_i - \hat{y}_i|$$

The measured data of the process "Reference Cube" (FIG. 4), which consists of 300 layers, are used in this example for evaluation. 75% of this data set is used for training and 25% for testing the NN. This data set is used to train and test different NN topologies, which differ in the number of hidden layers and in the number of neurons per hidden layer. Using the training data set, the topologies are trained unless a minimum in the cost function is reached for both channels. With the investigated amount of epochs, it is impossible for an over-adaptation to occur. After each epoch, the topology is evaluated using a test data set and the mean absolute deviation is calculated.

As the size and complexity of the NN increases, the error made by the network in the simulation decreases. Increasing the complexity also increases the time needed to train the network.

Figure 7:
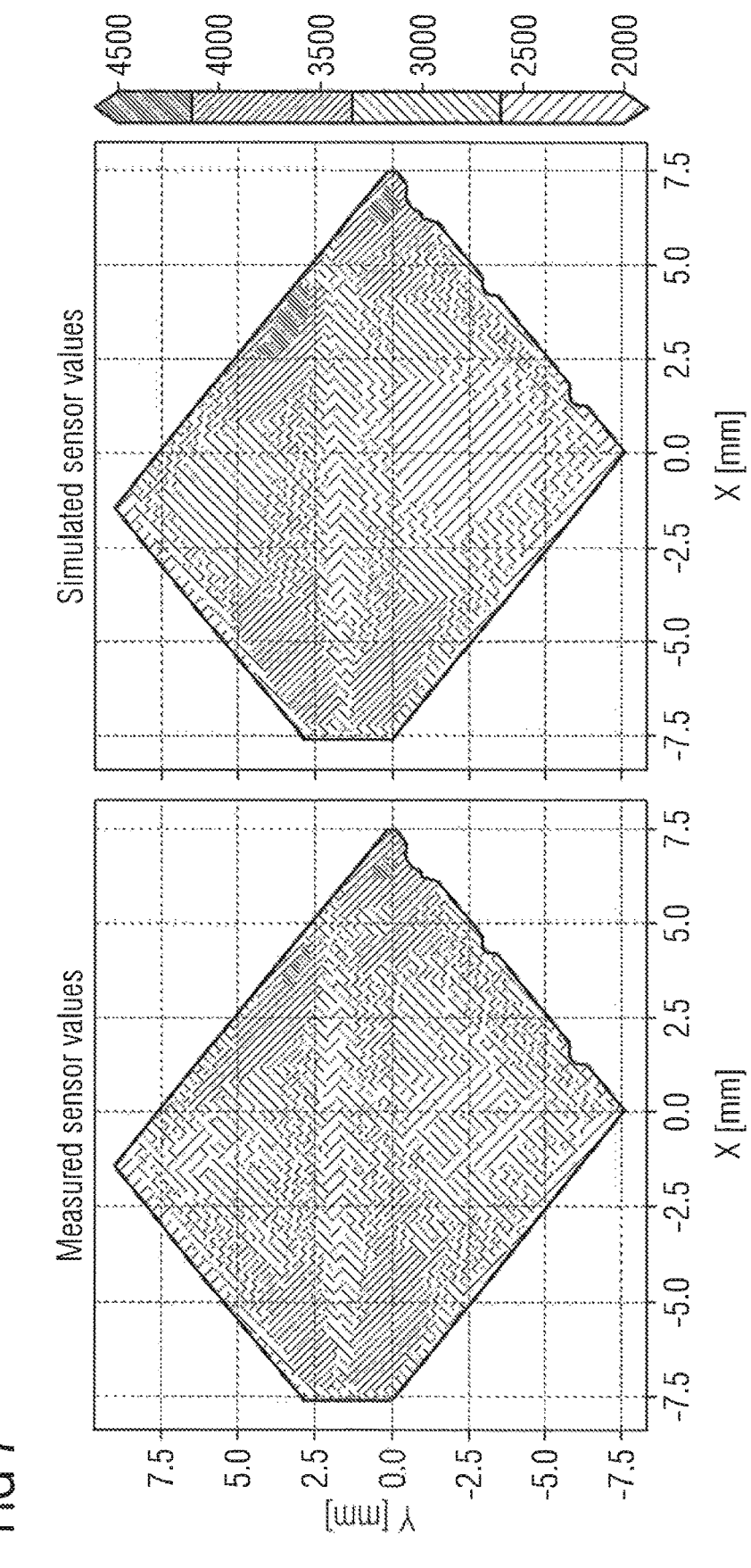
FIG. 7 shows real measured sensor values (left) and simulated sensor values (right) according to some example implementations as described herein.

To illustrate the simulation accuracy, FIG. 7 shows the real measured values (left) and the simulation (right) for channel 1 of layer 200 from the process "Reference Cube".

Figure 8:
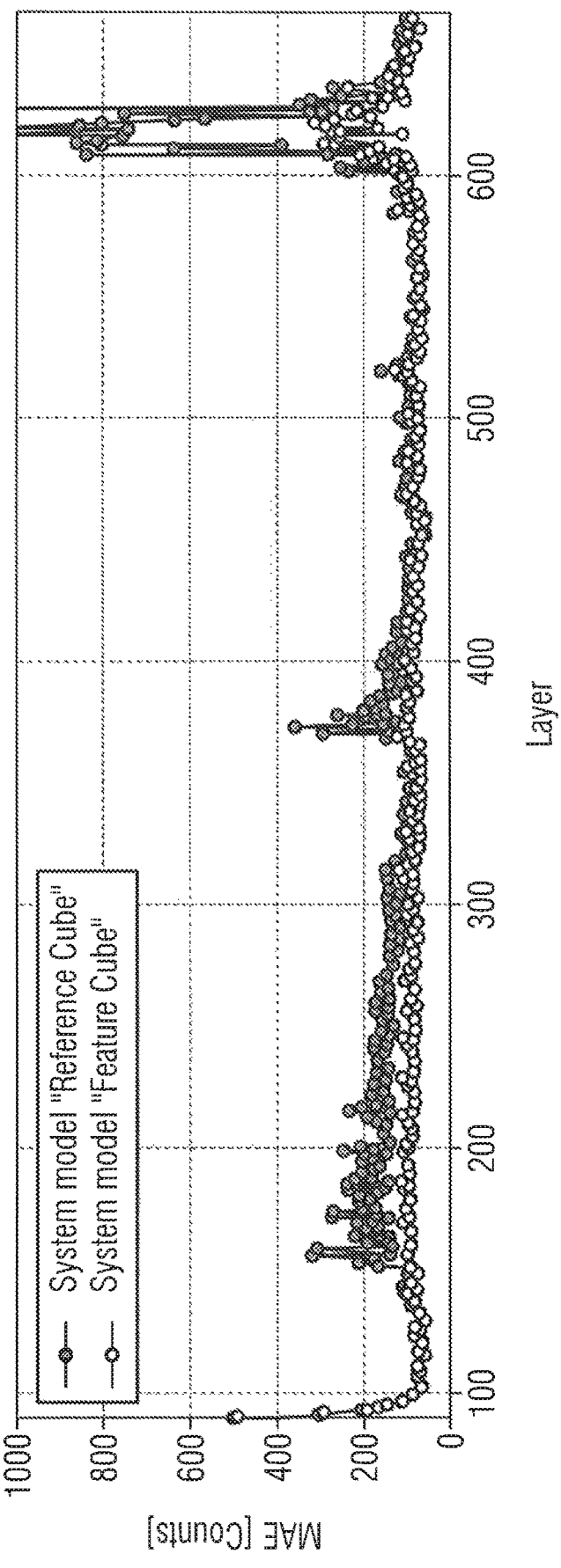
FIG. 8 shows mean absolute error of a simulation according to some example implementations as described herein.

In order for the system model to be universally applicable for different components, the simulation may need to be independent of the part geometry. The previously used system model "Reference Cube" is applied to the data of the process "Feature Cube" (FIG. 4) and the performance is evaluated. The existing special geometric cases are not known to the "Reference Cube" system model and can therefore be regarded as process instabilities (comparison of two identical series processes) and/or process anomalies (defects within a known geometry). The existing system model "Reference Cube" is then trained with a component from the "Feature Cube" process to determine whether this can improve performance. The measured data of the process "Feature Cube" consists of 668 layers. The resulting system model "Feature Cube" can then be compared with the original system model "Reference Cube". For evaluation, each layer of the parts from the "Feature Cube" process is simulated with both system models, the MAE calculated and analyzed. FIG. 8 shows the results of a part "Feature Cube", using channel 1 as an example.

The performance of both system models is comparable in many layers. Layers 1 to 85 are support structures whose high deflection can be explained by the damped heat conduction downwards into the supports and is not discussed further here. In the following layers, both system models have similar simulation accuracy, since the exposure area of these layers is similar to that of the "Reference Cube" process. As soon as layers vary from the exposure area due to special geometric cases (layers 125 to 450 and layers 600 to 650), the MAE of the "Reference Cube" system model is getting worse, see FIG. 8. Compared to the trained system model "Reference Cube", the trained system model "Feature Cube" shows approximately the same simulation error for both channels.

Figure 9:
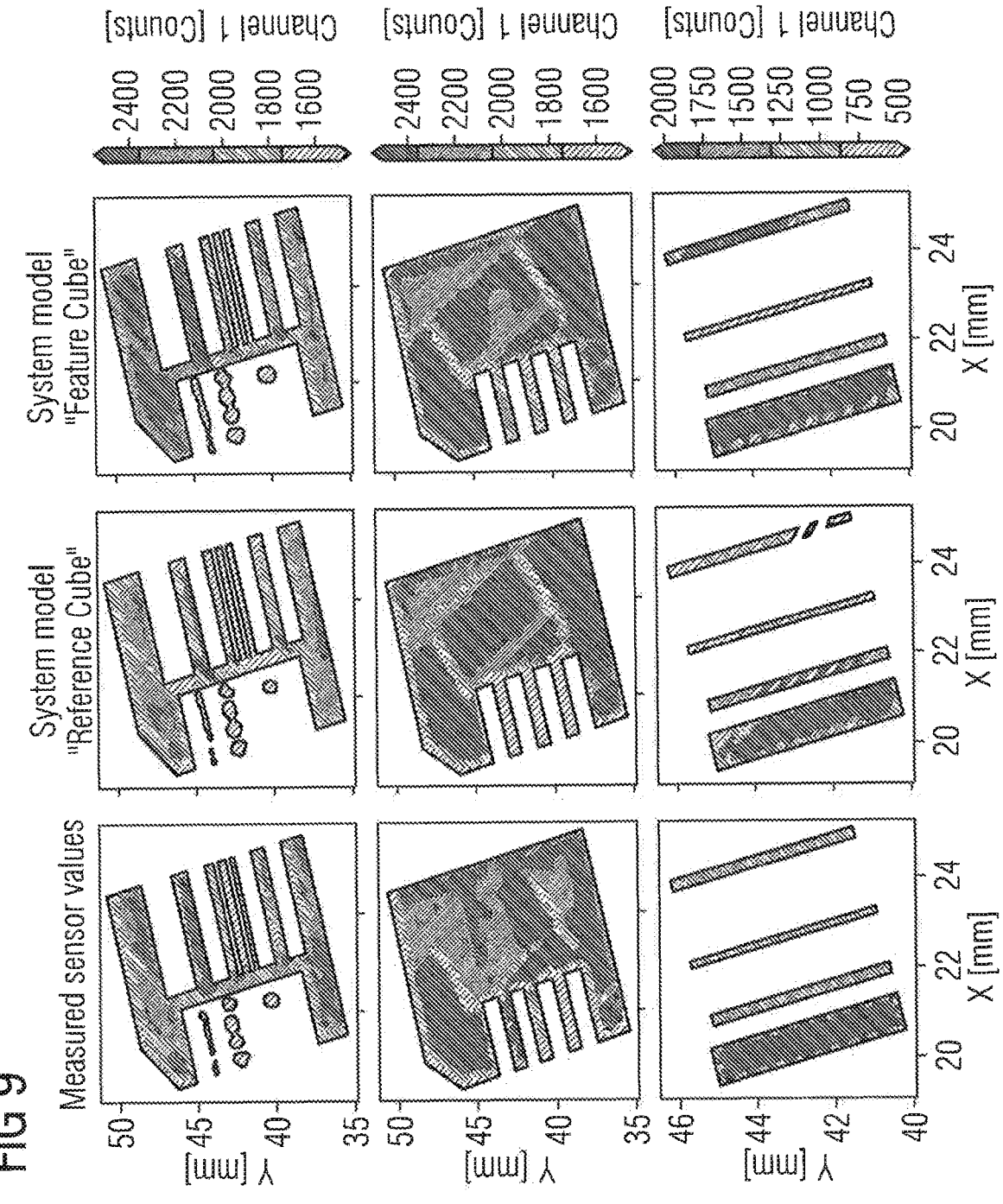
FIG. 9 shows example MPM measurement signals and simulations according to some example implementations as described herein.

FIG. 9 illustrate different system behavior exemplary for channel 1. It shows MPM measurement signals (left), the simulations with the system model "Reference Cube" (center) and the simulations with the system model "Feature Cube" (right) for the layers 175 (top), 521 (middle) and 625 (bottom) for channel 1.

It visualizes that the simulation with the system model "Reference Cube" shows large deviations especially with thin exposure areas and inner part corners, whereas the system model "Feature Cube" shows smaller deviations from the MPM signal. It is also possible to simulate part areas with real geometrical special cases by training using the chosen NN. FIG. 8 shows that the training brings the MAE in these layers back into the process noise range of approx. 160 counts.

As outlined above, it can be shown that with a primitive basic geometry as well as by introducing geometric features (simulation of a real component geometry), the model accuracy is >99% and, taking into account the current overall noise of the system, at least >93%. Thus it is possible to train an individual, customer-specific reference model with specified accuracy on the basis of an identical construction job or only a small number of layers of this construction job.

The model can be adapted as often as required. To be shown is a universal application on geometry, material or similar.

It is conceivable to have online training in addition to offline training as well as online evaluation in addition to offline evaluation.

The online evaluation can then be used to derive decision trees, such as pause, stop, closed-loop and open-loop control circuits such as Melt Pool Control by laser power, scanning speed, etc. or even the adaptation of scanning strategies in the current or subsequent process. For example a partial cancellation of a construction process could be possible, parts that are supposed to be defective are cancelled, whilst non defective parts of the build job would be finished. The simulation can be adapted online for a change in the parameters due to the partial cancellation.

Based on the methods and systems as described herein, an individual topology optimization of the geometry, the component position and component orientation on the building platform as well as the parameters to be used can be adapted, modified and optimized by prior parameter calculation based on the Selective Laser Melting data file. An upstream conventional simulation may not be necessary, although it may be possible.

The iterative process of determining and interpreting the process parameters of a material as a function of its geometry may be reduced in time. Various scenarios may be simulated in advance before a final construction process with optional destructive or non-destructive testing is carried out.

In order to further increase model accuracy, the addition of further input variables may be conceivable, in particular whereby the location—i.e. the separation of solidified and non-solidified (powder) material—is taken into account by considering the detection area at a time t.

Additionally or alternatively, in parallel to an already trained model, input and output variables of the artificial neural network may be considered while taking into account the layer n-1 or a multiple of it which have already been produced. In some examples, the third dimension (z direction) may be taken into account when generating the model.

Figure 10:
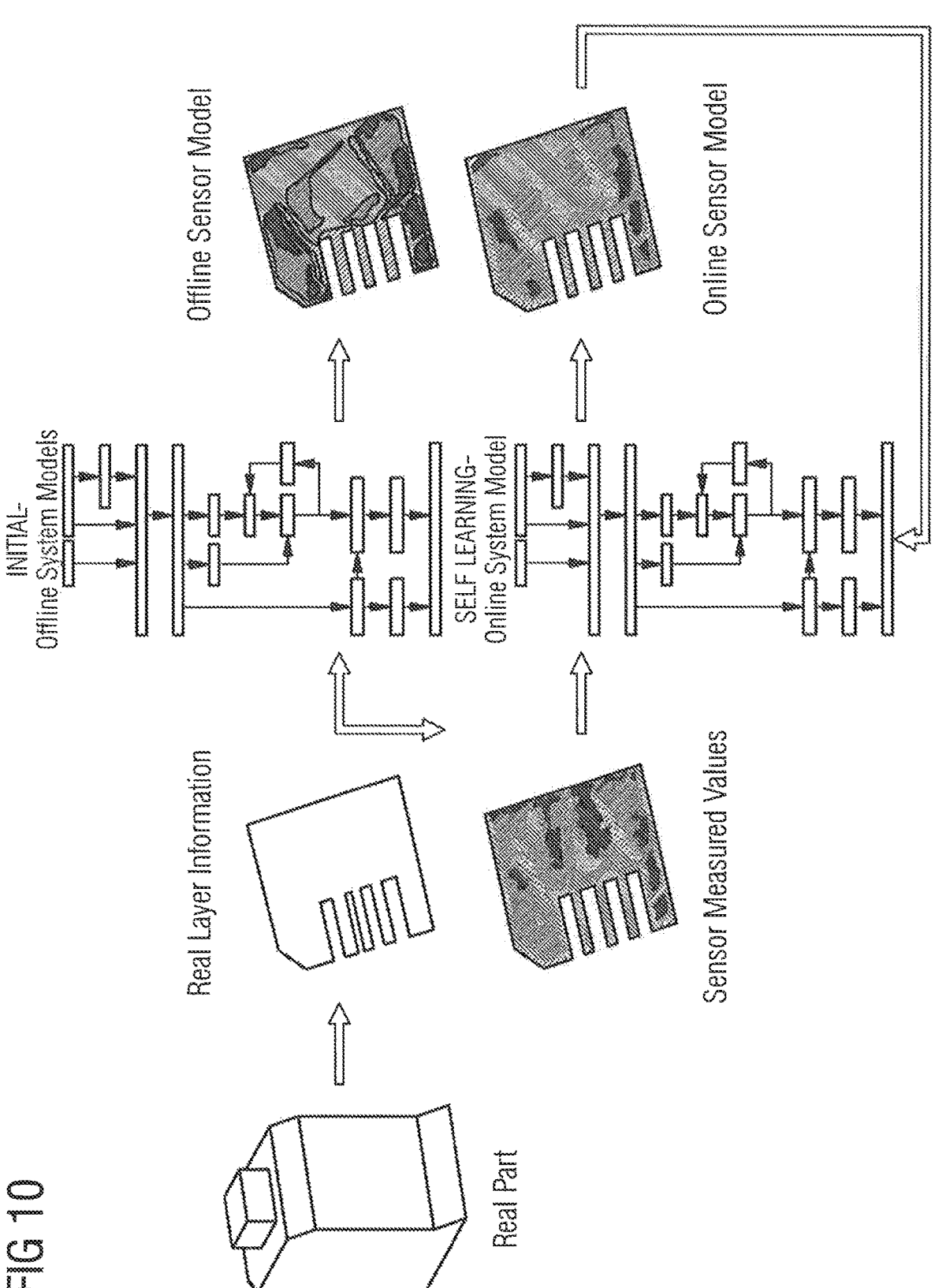
FIG. 10 shows online and offline training of models according to some example implementations as described herein.

Considering the previous output parameters as recurring input parameters for generating the model, the simulation may be more precise compared to the (ideal) offline system model. This is shown in FIG. 10, in which example online and offline sensor models are generated, whereby, in this example, the online sensor model output is fed back to improve the model.

In the SLM process, the local and global heat balance is also influenced by a further time and z-directionally variable layer-based time, in terms of heating time and cooling rate, which will ultimately be reflected in the output parameters.

Parameters previously determined can be used for training the model offline as well as for a further analysis approach in addition to the initial target/actual comparison during a production process (online). Training or at least data provision for slightly delayed training during the production time may also be conceivable.

Figure 11:
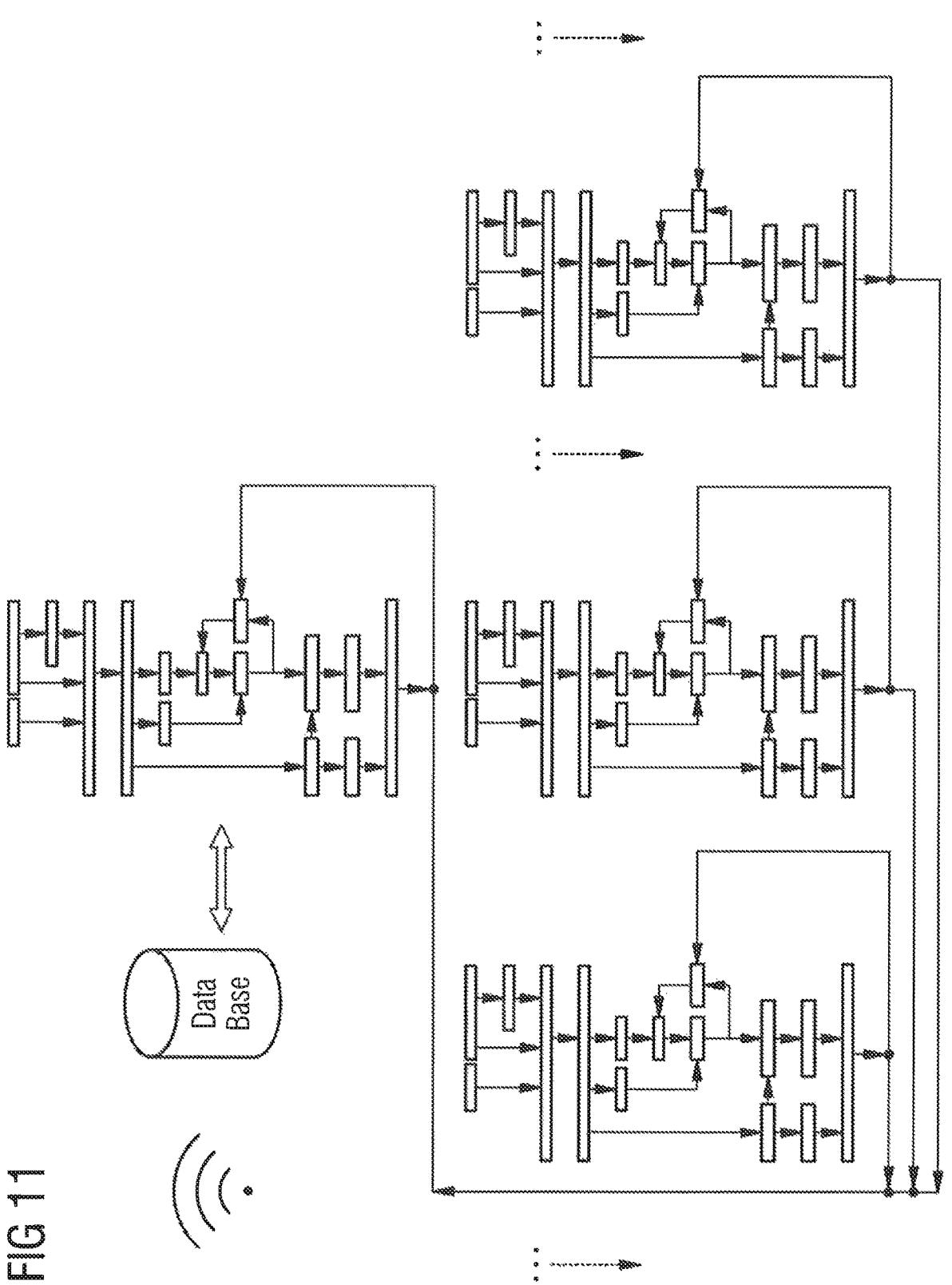
FIG. 11 shows a network of models connected to a database according to some example implementations as described herein.

FIG. 11 shows a network of models connected to a database. The network topology described above may hereby be supplemented to the extent that the resulting target/actual comparison of a complete production process, depending on the application, may be carried out on the basis of the already existing network topology, again as input parameters for the extended optimization of a local— at the lower level occurring isolated application system of, for example, a machine, a material of one and the same machine, a certain number of machine systems of a production plant or similar—network topology. One level higher— here the topmost concept shown in the middle of FIG. 11—a network topology of a higher instance could also be used to profit disproportionately from the data provided and to serve as a master system. In this case, a certain number of machine systems of a manufacturing company at different locations or a higher-level service, for example that of a machine manufacturer, may be conceivable. All local concepts could benefit from this in that the knowledge advantage may be made available to the local networks on the basis of considerably more usage data, equally or filtered.

Several artificial neural networks may be combined. An existing network may be implemented by a multidimensional neural folding network. This may allow for better consideration of the geometry condition in the z direction.

To verify possible local defects, the use of an additional measuring system may be used.

The present disclosure shows that and how the data of the in-situ melt pool monitoring system used here can be simulated, in particular with a machine learning algorithm based on an artificial neural network. This ANN is capable of predicting the real sensor output of the MPM system, largely independent of geometry. Accuracy deteriorates with increasing complexity of the part geometry. The comparison of measured and simulated data has shown that both part areas can be simulated with real geometries by training using a NN, process instabilities can be detected and used as indicators for process stability. The results show that the simulation of MPM data can be used for the documentation and quality assurance of the Selective Laser Melting respectively metal additive manufacturing process in a targeted manner and depending on the problem at hand.

The evaluation of the individual layers shows that for some complex geometries the deviation between measured and simulated signal is higher. On the one hand, this challenge may be solved by considering the allocation, the distribution and the arrangement of the solidified and the non-solidified (powder) material to each other in the total build volume for the ANN. On the other hand, this finding offers the possibility to derive and verify potentially further input parameters from the existing database and could result in an ANN trained on the basis of a basic geometry being sufficient to identify further special cases and use cases. Simulation accuracy of the complex geometries as well as the deviation between measured and simulated signal could be further improved by combining the ANN used with other network topologies. In addition to the current state, the transferability to longer process times with holistically real and more voluminous or higher parts as well as different materials may then take place. The comparison of measurement and simulation data can be used for the quantitative detection of certain anomalies and classifications of anomalies or for the detection of further process irregularities due to different error scenarios during the process. In this context, the detector-specific total noise may be improved, in order to then take appropriate actions to reduce it. In addition, process parameters and part geometries can be optimized with the simulation model of the MPM with regard to the thermal load before the actual build process begins.

Systems and methods according to the present disclosure differ from the prior art in that data from post-process monitoring, such as CT data, may not need to be used as a reference. Instead, the system behavior of the process monitoring with reference process parameters (user-specific process parameters defined as standard from data preprocessing in the SLM process such as laser power as well as component orientation and component positioning or geometric features such as component overhangs, drill holes, etc. as well as the resulting heat dissipation and the percentage of solidified material or the percentage of powder material at time t within the detection area) is taken as a reference. With these process parameters, less (compared to when these parameters are not taken into account) or no defects occur. If there is a deviation from this referenced system behavior, the component quality cannot be guaranteed and errors in the component structure could have occurred.

On the other hand, systems and methods according to the present disclosure may not be compared with a "conventional" and established thermal simulation, since these underlying thermal/physical principles do not take into account the technological and process-related boundary conditions of powder bed-based additive manufacturing processes using laser-metal powder interaction.

Figure 12:
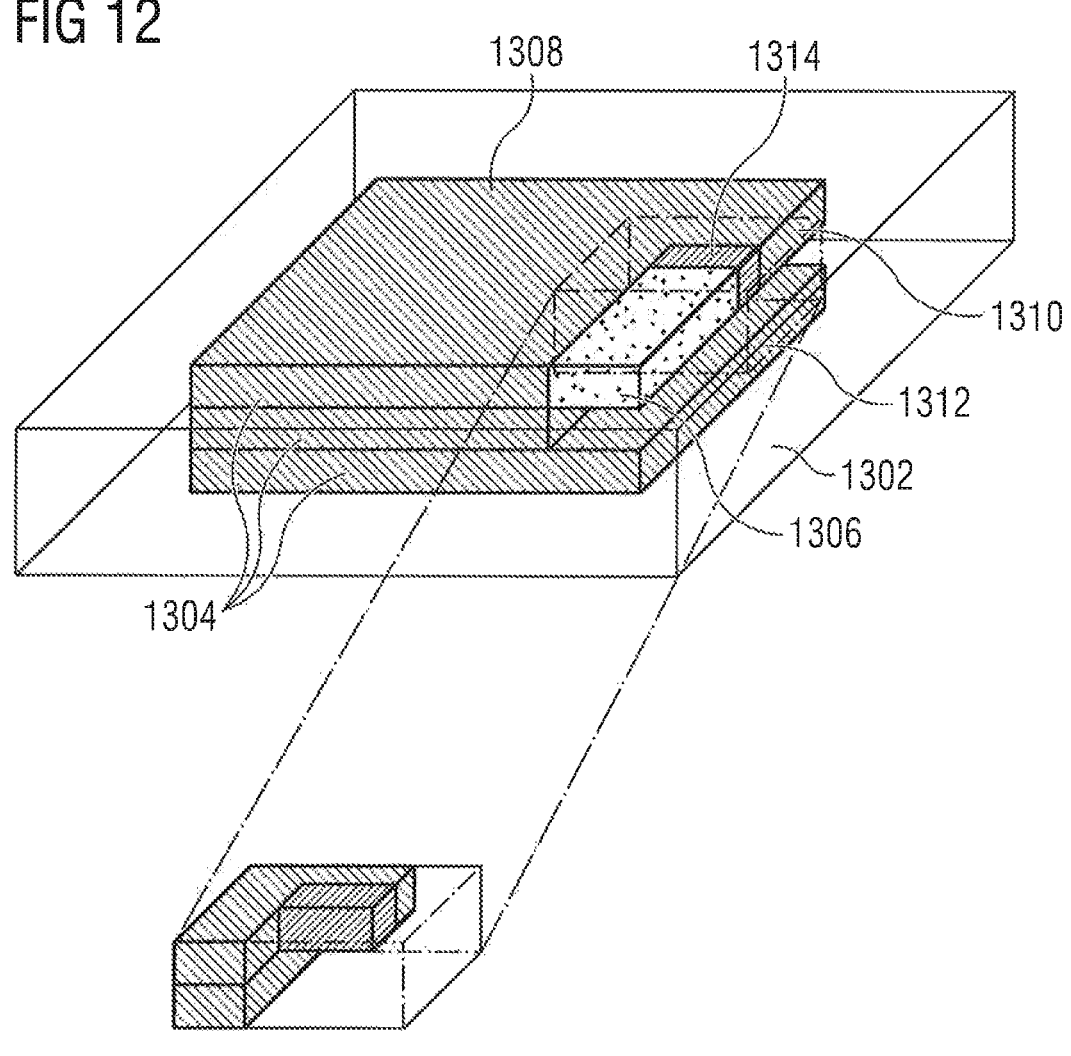
FIG. 12 shows powder bed, workpiece and registration volume and area according to some example implementations as described herein.

In the example shown in FIG. 12, a powder bed 1302 with solidified material 1308 and material to be solidified 1306 is shown. Different workpiece layers 1304 are indicated. The surrounding powder bed 1302 is filled with material not being solidified, not shown in the figure for reasons of clarity.

In this example, a registration volume 1312 which is, in this example, two layers deep is determined. Additionally, in this example, a registration area 1310 is determined, which is identical with the top surface of the registration volume 1312 and lies in the working plane, i.e. the top surface of the powder bed 1302. In this example, the area and the volume are larger than an area and volume in which the three-dimensional workpiece is to be produced in a specific point in time, in other words an area and volume of a melt pool 1314. In the shown example, the melt pool 1314 lies in the center of the registration area 1310. It is clear, that in an alternative embodi-ment the melt pool 1314 could also lie eccentric inside the registration area 1310 or even outside the registration area 1310, in particular in front of the registration area 1310 when seen from a moving direction. Although shown in the example only one layer deep it is clear that the melt pool 1314 could also be several layers deep, and even deeper than the registration volume 1312, so the registration volume 1312 would only include a part of the melt pool 1314.

For a specific point in time, it is determined which part of parts of the registration area 1310 and/or the registration volume 1312 have already been solidified and which part of parts thereof are yet to be solidified. Alternatively or additionally, it is determined which part or parts of the registration area 1310 and/or the registration volume 1312 have already been solidified and which part or parts thereof have not been solidified. Based on this determination, a parameter influencing an additive layer manufacturing process is determined in dependence of the part of parts of the registration area 1310 and/or the registration volume 1312 which have already been solidified and which part of parts thereof are yet to be solidified (that is, their ratio and/or allocation and/or distribution and/or arrangement relative to each other). This determination is based on the powder surrounding the part of parts which have already been solidified acts as a thermal insulator and has a lower thermal conductivity than molten or solidified material. For the determination of the parameter influencing the additive layer manufacturing process also the processing times from parts of the registration area 1310 and/or the registration volume 1312 which have already been solidified could be (additionally or alternatively) considered, so it is possible to determine the specific temperature of the part or parts of the registration area 1310 and/or the registration volume 1312 which have already been solidified at a specific point of time. It is also possible to use this for a two- or three-dimensional mapping. For the determination of the temperature or a corresponding indicator of parts which have already been solidified, in particular in underlying layers, data could be used from a simulation and/or real sensor data from the melt pool monitoring system.

Figure 13:
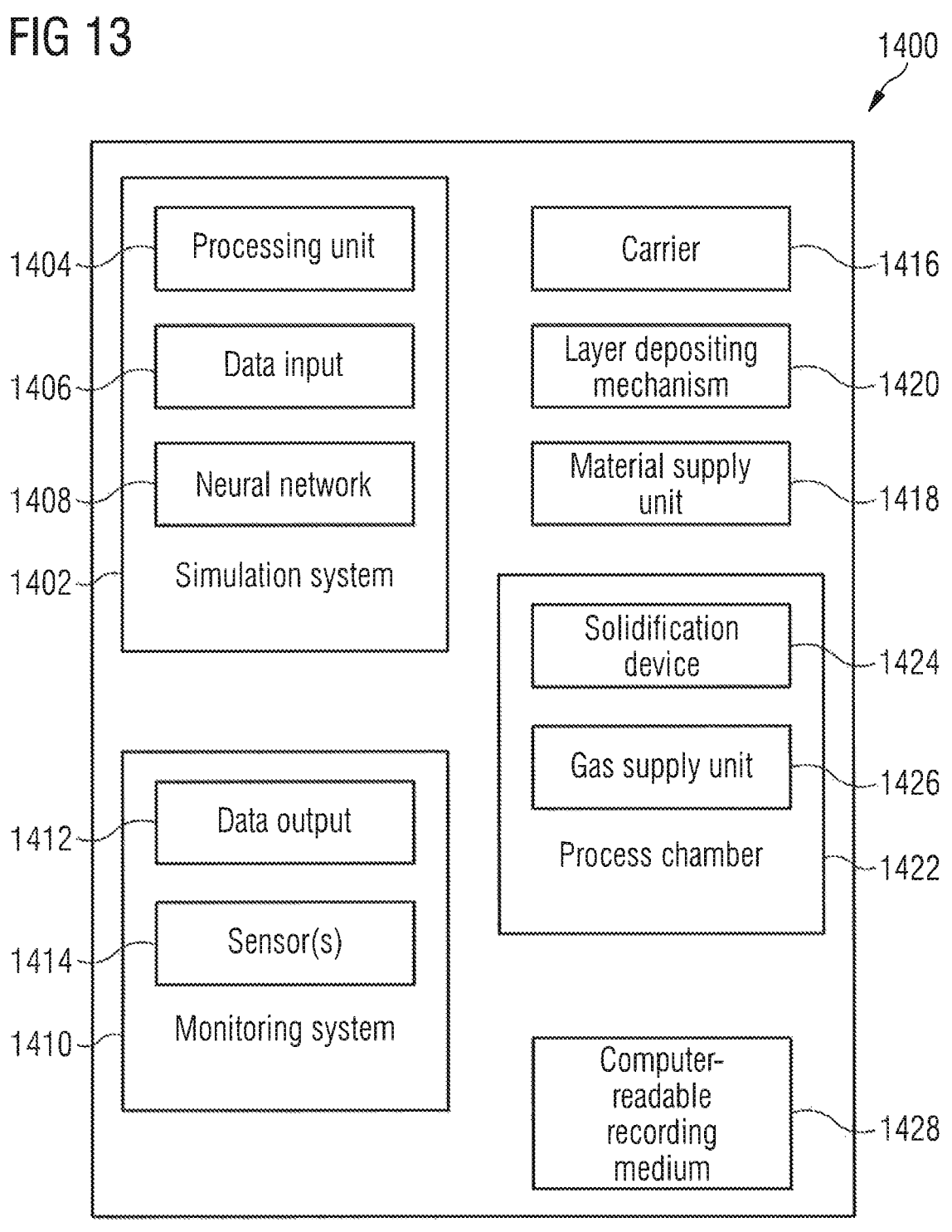
FIG. 13 shows a schematic block diagram of an apparatus for producing a three-dimensional workpiece according to some example implementations as described herein.

FIG. 13 shows an apparatus 1400 for producing a three-dimensional workpiece.

In this example, the apparatus 1400 comprises a simulation system 1402, which comprises a processing unit 1404, a data input 1406 and an artificial neural network 1408 according to example implementations as described herein.

Furthermore, in this example, the apparatus 1400 comprises a melt pool monitoring system 1410 comprising one or more sensors 1414 for monitoring a melt pool during a selective laser melting process, and a data output 1412 for outputting data relating to monitoring of the melt pool.

In this example, the apparatus 1400 further comprises a carrier 1416 configured to receive powder material from which a three-dimensional object is to be produced. A layer depositing mechanism 1420 is provided in order to spread material supplied via the material supply unit 1418 over the carrier 1416.

In this example, the apparatus 1400 further comprises a process chamber 1422 comprising a solidification device 1424 and a gas supply unit 1426 for providing a process and/or shielding gas during the selective laser melting process.

In this example, the apparatus 1400 further comprises a computer-readable recording medium 1428 in particular for storing a model for simulating monitoring of the melt pool and/or analyzed/simulated sensor data according to example implementations as described herein.

FIG. 14 shows a method 1500 for determining a parameter influencing an additive layer manufacturing process according to example implementations as described herein.

In this example, the method 1500 comprises, at step S1502, determining an area and/or a volume of one or more material layers. At step S1504, the method 1500 comprises determining, for a specific point in time, which part or parts of the area and/or volume of the one or more material layers have already been solidified. Afterwards, at step S1506, the parameter influencing an additive layer manufacturing process is determined in dependence of the part or parts of the area and/or volume of the one or more material layers determined to already have been solidified.

FIG. 15 shows a method 1600 for determining a reference parameter using the determined parameter and an input parameter according to example implementations as described herein.

In this example, the method 1600 comprises determining a parameter influencing an additive layer manufacturing process used to solidify material from which a three-dimensional workpiece is to be produced according to the method 1500 shown in FIG. 14. At step S1602, the parameter is fed into a model for simulating the monitoring of the melt pool. A reference parameter is then determined at step 1604 using the determined parameter and an input parameter.

FIG. 16 shows a method 1700 for providing analyzed sensor data on a computer-readable recording medium according to example implementations as described herein.

In this example, sensor data relating to a melt pool monitored or previously monitored by a melt pool monitoring system during a selective laser melting process is provided at step S1702.

Furthermore, at step S1704, a model for simulating monitoring of a said melt pool is being provided. The model may have been generated based on the melt pool of a current selective laser melting process and/or a melt pool generated earlier.

At step S1706, the method 1700 comprises analyzing the sensor data based on a comparison between the sensor data and sensor data simulated using the model.

At step S1708, the analyzed sensor data is then provided on a computer-readable recording medium.

We further describe a method for determination of an influence value for the generative generation of a 3-dimensional structure through layer-by-layer consolidation of a flowable (legged) material by means of an energy input into the material at a specific location of the structure to be generated (or its virtual model) at a certain point in time when the structure is created (or simulated), whereby a registration area or registration volume is provided, which is in a certain positional relationship to the specific location, and the influence value is determined depending on the structure already created in the registration area/volume at the given time.

The method comprises in particular:
that the specified location is the place of energy input at the specified time, and/or
that the influence value is determined depending on the ratio of the structure already created at the given time to the remaining area/volume in the recording area/volume, and/or
that the influence value is determined depending on the ratio of the structure already generated at the specific point in time to the structure still to be generated in the registration area/volume, and/or
that the influence value is determined depending on the locations of the energy input at already past times in the registration area/volume, and/or
that the influence value is used for the interpretation of a measured value where the recording range corresponds to a measuring range, and/or
that the registration area is larger than the location of the energy input (and/or its interaction zone), and/or
that the recording volume has a depth of one, two or more layer thicknesses, and/or
that the influence value is used to calculate a virtual simulation, and/or
that, based on the simulation, structural optimizations are proposed, and/or
that the influence value serves as an input parameter for the determination of an effect value, which is determined in dependence of at least one further input parameter selected from one or more of: one or more environment parameters, one or more structure parameters, one or more material parameters, one or more measuring method parameters, one or more apparatus parameters and one or more process parameters, and/or
that the effect value is determined as the output value of an artificial neural network, and/or
that the one or more input parameters of the ANN are preferably constants or one-dimensional time series, and/or
that the effective value of the ANN is used as reference value for the interpretation of a measured value, and/or
that the measured value itself serves to determine the influence value and/or as input parameter of the ANN.

We further describe a computer program product for performing the aforesaid determination.

No doubt many other effective alternatives will occur to the skilled person. It will be understood that the invention is not limited to the described embodiments and example implementations and encompasses modifications apparent to those skilled in the art and lying within the scope of the claims appended hereto.

The invention claimed is:

1. A system for simulating process monitoring by a sensor system in an additive layer manufacturing, selective laser melting, process used to solidify material from which a three-dimensional workpiece is to be produced, wherein the system comprises:
a data input couplable to a data output of the sensor system and configured to receive, from the sensor system, sensor data relating to the process monitored by the sensor system, wherein the data input is further configured to receive one or more input parameters (i) relating to the additive layer manufacturing process and/or (ii) associated with an additive layer manufacturing apparatus used for the additive layer manufacturing process and/or (iii) associated with the process monitoring and/or the sensor system, wherein the one or more input parameters relate to or are calculated based on a ratio between non-solidified material and solidified material in the detection range of the sensor system; and a processing unit coupled to the data input and configured to generate, from the sensor data and the one or more input parameters, a model for simulating said process monitoring.

2. A system as claimed in claim 1, wherein the ratio between non-solidified material and solidified material in the detection range comprises a ratio between non-solidified material and solidified material in the detection range in a predefined number of material layers.

3. A system as claimed in claim 1, wherein the system is configured to calculate the one or more input parameters as a function of time.

4. A system as claimed in claim 1, wherein the system is configured to calculate the one or more input parameters for a defined material layer based on one or more output parameters output based on a said simulation for one or more material layers lying below the defined material layer.

5. A system as claimed in claim 4, wherein the system is configured to calculate the one or more input parameters for (i) a first plurality of material layers based on one or more output parameters output based on a said simulation for a second plurality of materials layers lying below the first plurality of material layers, and/or (ii) a said material layer or plurality of material layers based on one or more parameters indicating when one or more lower-lying layers were or have been irradiated, wherein the one or more parameters indicating when the one or more lower-lying layers were or have been irradiated are location-dependent parameters.

6. A system as claimed in claim 1, wherein the system is configured to simulate sensor data which is output by the sensor system based on the model and the one or more input parameters, wherein the sensor data which is output by the sensor system comprises (i) the sensor data used to generate, by the processing unit, the model, and/or (ii) sensor data which is output by the sensor system after the model has been generated.

7. A system as claimed in claim 6, wherein the system is configured to: compare the sensor data which is output by the sensor system with the simulated sensor data; and detect an anomaly and/or process error during the additive layer manufacturing process based on said comparison, wherein the system is configured to perform said comparison in-situ during the additive layer manufacturing process, and wherein the system is configured to provide, based on said comparison, a signal to the additive layer manufacturing apparatus to adapt the current additive layer manufacturing process.

8. A system as claimed in claim 1, wherein the system is configured to (i) generate a database comprising the generated model for subsequent use in a said simulation, and/or (ii) adapt, based on the simulation model, a process parameter for the additive layer manufacturing process and/or a geometry of the three-dimensional workpiece produced using the additive layer manufacturing process.

9. A computer program product comprising program code portions for simulating, using the model generated using the system of claim 1, process monitoring by a sensor system in an additive layer manufacturing process, wherein the computer program product is stored on a computer-readable recording medium.

10. A system for simulating process monitoring by a sensor system in an additive layer manufacturing, selective laser melting, process used to solidify material from which a three-dimensional workpiece is to be produced, wherein the system comprises:

a data input couplable to a data output of the sensor system and configured to receive, from the sensor system, sensor data relating to the process monitored by the sensor system, wherein the data input is further configured to receive one or more input parameters (i) relating to the additive layer manufacturing process and/or (ii) associated with an additive layer manufacturing apparatus used for the additive layer manufacturing process and/or (iii) associated with the process monitoring and/or the sensor system; and a processing unit coupled to the data input and configured to generate, from the sensor data and the one or more input parameters, a model for simulating said process monitoring, wherein the process monitoring comprises a monitoring of a melt pool, the sensor system comprises a melt pool monitoring system and the model for simulating said process monitoring comprises a model for simulating said monitoring of the melt pool, and wherein the sensor data relating to the melt pool monitored by the melt pool monitoring system comprises sensor data associated with one or more of:

a property of the melt pool;

radiation originating from the melt pool comprising thermal radiation originating from the melt pool;

radiation originating from solidified material;

a property of a plasma stemming from the additive layer manufacturing process used to generate the melt pool, the plasma originating from material evaporated from the melt pool; radiation originating from the plasma comprising thermal radiation originating from the plasma; and radiation reflected and/or diffracted from the melt pool and/or the plasma comprising laser radiation stemming from a laser used to generate the melt pool.

11. A system for simulating process monitoring by a sensor system in an additive layer manufacturing, selective laser melting, process used to solidify material from which a three-dimensional workpiece is to be produced, wherein the system comprises:

a data input couplable to a data output of the sensor system and configured to receive, from the sensor system, sensor data relating to the process monitored by the sensor system, wherein the data input is further configured to receive one or more input parameters (i) relating to the additive layer manufacturing process and/or (ii) associated with an additive layer manufacturing apparatus used for the additive layer manufacturing process and/or (iii) associated with the process monitoring and/or the sensor system; and a processing unit coupled to the data input and configured to generate, from the sensor data and the one or more input parameters, a model for simulating said process monitoring, wherein the one or more input parameters relate to or are calculated based on a distribution and/or an arrangement of areas and/or volumes of non-solidified material and solidified material relative to each other in a detection range of the sensor system.

12. A system for simulating process monitoring by a sensor system in an additive layer manufacturing, selective laser melting, process used to solidify material from which a three-dimensional workpiece is to be produced, wherein the system comprises:

a data input couplable to a data output of the sensor system and configured to receive, from the sensor system, sensor data relating to the process monitored by the sensor system, wherein the data input is further configured to receive one or more input parameters (i) relating to the additive layer manufacturing process and/or (ii) associated with an additive layer manufacturing apparatus used for the additive layer manufacturing process and/or (iii) associated with the process monitoring and/or the sensor system; and a processing unit coupled to the data input and configured to generate, from the sensor data and the one or more input parameters, a model for simulating said process monitoring, wherein the one or more input parameters comprise (i) one or more parameters defining a location of solidified or non-solidified material within the detection range of the sensor system, and/or (ii) one or more of a thermal conductivity, a radiation property and a temperature of the non-solidified material and the solidified material, respectively, in the detection range of the sensor system.

13. A system for simulating process monitoring by a sensor system in an additive layer manufacturing, selective laser melting, process used to solidify material from which a three-dimensional workpiece is to be produced, wherein the system comprises:

a data input couplable to a data output of the sensor system and configured to receive, from the sensor system, sensor data relating to the process monitored by the sensor system, wherein the data input is further configured to receive one or more input parameters (i) relating to the additive layer manufacturing process and/or (ii) associated with an additive layer manufacturing apparatus used for the additive layer manufacturing process and/or (iii) associated with the process monitoring and/or the sensor system; and a processing unit coupled to the data input and configured to generate, from the sensor data and the one or more input parameters, a model for simulating said process monitoring, wherein the one or more input parameters comprise or relate to one or more of:

a radiation beam power;

a scan speed of a radiation beam used in the additive layer manufacturing process;

a hatch distance used in the additive layer manufacturing process;

a material layer thickness of the material;

a radiation beam diameter;

a heat dissipation during the additive layer manufacturing process;

a physical property of the material to be solidified;

an optical surface and/or a scanning unit and/or a laser and/or a layer depositing unit of the additive layer manufacturing apparatus and/or a gas flow and/or a temperature distribution within the additive layer manufacturing apparatus; and a scan strategy used in the additive layer manufacturing process comprising a position of the radiation beam on a layer of the material and/or a deflection angle of the radiation beam and/or a vector angle and/or vector length of a vector for scanning the radiation beam across the material layer and/or a scanning direction for scanning the radiation beam across the material layer with respect to a gas flow direction.

14. A method for determining a parameter influencing an additive layer manufacturing process used to solidify material from which a three-dimensional workpiece is to be produced, the method comprising:

determining an area and/or a volume of one or more material layers;

determining, for a specific point in time, which part or parts of the area and/or volume of the one or more material layers have already been solidified; and determining the parameter influencing an additive layer manufacturing process in dependence of the part or parts of the area and/or volume of the one or more material layers determined to already have been solidified.

15. A method as claimed in claim 14, wherein the parameter is determined based on (i) a first ratio, for the specific point in time, between solidified and non-solidified material in the area and/or in the volume, and/or (ii) a second ratio, for the specific point in time, between solidified material and material to be solidified in the area and/or in the volume in order to produce the three-dimensional workpiece.

16. A method as claimed in claim 14, wherein the parameter is determined based on a location of previously solidified material in the area and/or in the volume.

17. A method as claimed in claim 14, wherein the area and/or volume is larger than an area and/or volume, respectively, in which the three-dimensional workpiece is to be produced using the additive layer manufacturing process.

18. A method as claimed in claim 14, further comprising feeding the parameter into a model for simulating process monitoring comprising monitoring of a melt pool, by a sensor system comprising a melt pool monitoring system, in the additive layer manufacturing process used to solidify material from which the three-dimensional workpiece is to be produced.

19. A method as claimed in claim 18, further comprising determining a reference parameter using the determined parameter and an input parameter, wherein the input parameter comprises one or more of:

a parameter relating to an environment of an apparatus used for the additive layer manufacturing process, a parameter relating to a physical property of the material to be solidified, a parameter relating to the process monitoring, a parameter relating to the apparatus used for the additive layer manufacturing process, and a parameter relating to the additive layer manufacturing process; and wherein the method further comprises interpreting a sensor signal output by the sensor system using the reference parameter.

* * * * *